United States Patent
Vasylyev

(10) Patent No.: US 10,797,191 B2
(45) Date of Patent: *Oct. 6, 2020

(54) LIGHT TRAPPING OPTICAL STRUCTURE

(71) Applicant: Sergiy Vasylyev, Elk Grove, CA (US)

(72) Inventor: Sergiy Vasylyev, Elk Grove, CA (US)

(73) Assignee: SVV TECHNOLOGY INNOVATIONS, INC., Sacramento, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/584,727

(22) Filed: May 2, 2017

(65) Prior Publication Data

US 2017/0235115 A1 Aug. 17, 2017

Related U.S. Application Data

(63) Continuation of application No. 14/181,439, filed on Feb. 14, 2014, now Pat. No. 9,678,321, which is a continuation of application No. 13/572,629, filed on Aug. 11, 2012, now abandoned, which is a continuation of application No. 13/345,738, filed on Jan. 8, 2012, now Pat. No. 8,290,318, which is a continuation-in-part of application No. 12/764,867, filed on Apr. 21, 2010, now Pat. No. 9,256,007.

(60) Provisional application No. 61/214,331, filed on Apr. 21, 2009, provisional application No. 61/461,522, filed on Jan. 18, 2011.

(51) Int. Cl.
*H01L 31/05* (2014.01)
*H01L 31/054* (2014.01)
*H02S 40/22* (2014.01)
*G02B 3/00* (2006.01)

(52) U.S. Cl.
CPC ........ *H01L 31/0547* (2014.12); *H01L 31/054* (2014.12); *H01L 31/0543* (2014.12); *H02S 40/22* (2014.12); *G02B 3/005* (2013.01); *G02B 3/0056* (2013.01); *Y02E 10/52* (2013.01)

(58) Field of Classification Search
CPC ... G02B 19/0028; H02S 40/22; H01L 31/054; H01L 31/0543; H01L 31/0547; Y02E 10/52
USPC ....... 385/33, 36; 136/246, 259; 257/E25.009
See application file for complete search history.

(56) References Cited

U.S. PATENT DOCUMENTS 5,404,869 A * 4/1995 Parkyn, Jr. ............ F21V 7/0091
126/698
5,560,700 A * 10/1996 Levens ..................... F21S 2/00
136/246

(Continued)

*Primary Examiner* — Robert Tavlykaev

(57) ABSTRACT

A light trapping optical structure employing an optically transmissive layer with a plurality of light deflecting elements. The transparent layer is defined by opposing broad-area surfaces extending parallel to each other. The light deflecting elements deflect light propagating transversely through the optically transmissive layer at a sufficiently high bend angle with respect to a surface normal, above a critical angle of a Total Internal Reflection. The deflected light is retained by means of at least TIR in the system which allows for longer light propagation paths through a photoabsorptive layer that may be associated with the optically transmissive layer for an improved light absorption. The light trapping optical structure may further employ a focusing array of light collectors being pairwise associated with the respective light deflecting elements.

20 Claims, 12 Drawing Sheets

(56) References Cited

U.S. PATENT DOCUMENTS

| | | |
|---|---|---|
| 6,008,449 A | 12/1999 | Cole |
| 6,274,860 B1 | 8/2001 | Rosenberg |
| 6,333,458 B1 | 12/2001 | Forrest et al. |
| 6,440,769 B2 | 8/2002 | Peumans et al. |
| 7,672,549 B2 | 3/2010 | Ghosh et al. |
| 7,817,885 B1 | 10/2010 | Moore et al. |
| 8,338,693 B2 | 12/2012 | Raymond et al. |
| 8,354,583 B2 | 1/2013 | Zaban et al. |
| 8,402,647 B2 | 3/2013 | Chui et al. |
| 2004/0103938 A1 | 6/2004 | Rider |
| 2008/0264483 A1 | 10/2008 | Keshner et al. |
| 2009/0126792 A1 | 5/2009 | Gruhlke et al. |
| 2009/0199900 A1 | 8/2009 | Bita et al. |
| 2010/0180929 A1 | 7/2010 | Raymond et al. |
| 2010/0186798 A1 | 7/2010 | Tourmen et al. |
| 2010/0278480 A1 | 11/2010 | Vasylyev |
| 2011/0226332 A1 | 9/2011 | Ford et al. |
| 2012/0012741 A1 | 1/2012 | Vasylyev |

\* cited by examiner

LIGHT TRAPPING OPTICAL STRUCTURE

CROSS-REFERENCE TO RELATED APPLICATIONS

This application is a continuation of application Ser. No. 14/181,439, filed Feb. 14, 2014, now U.S. Pat. No. 9,678,321, which is a continuation of application Ser. No. 13/572,629, filed Aug. 11, 2012, now abandoned, which is a continuation of application Ser. No. 13/345,738, filed Jan. 8, 2012, now U.S. Pat. No. 8,290,318, which is a continuation-in-part of application Ser. No. 12/764,867, filed Apr. 21, 2010, now U.S. Pat. No. 9,256,007. This application also claims priority from U.S. provisional application Ser. No. 61/214,331 filed on Apr. 21, 2009, and U.S. provisional application Ser. No. 61/461,522 filed on Jan. 18, 2011, incorporated herein by reference in its entirety.

STATEMENT REGARDING FEDERALLY SPONSORED RESEARCH OR DEVELOPMENT

Not Applicable

INCORPORATION-BY-REFERENCE OF MATERIAL SUBMITTED ON A COMPACT DISC

Not Applicable

NOTICE OF MATERIAL SUBJECT TO COPYRIGHT PROTECTION

A portion of the material in this patent document is subject to copyright protection under the copyright laws of the United States and of other countries. The owner of the copyright rights has no objection to the facsimile reproduction by anyone of the patent document or the patent disclosure, as it appears in the United States Patent and Trademark Office publicly available file or records, but otherwise reserves all copyright rights whatsoever. The copyright owner does not hereby waive any of its rights to have this patent document maintained in secrecy, including without limitation its rights pursuant to 37 C.F.R. § 1.14.

BACKGROUND OF THE INVENTION

1. Field of the Invention

The present invention relates to a device and method for enhancing the light trapping in light harvesting devices. Particularly, the present invention relates to collecting light from a large surface area of the light harvesting device comprising a light absorbing material and trapping the light within the device so as to increase the optical path through the light absorbing material and improve the useful light absorption. More particularly, the present invention relates to enhancing the light trapping in photovoltaic solar panels, light detectors, day lighting systems, bioreactors, water light-treatment reactors, and the like.

2. Description of Background Art

Many light harvesting devices employ a light-absorbing active layer that has at least a partial transparency with respect to the incident light or absorbs more weakly in certain wavelengths than in the others. Conventionally, the absorption in such devices can be improved by increasing the thickness of the active layer. However, this results in the increased system dimensions, material consumption, weight and cost. Alternatively, light trapping approaches are well known in which the light path is altered within the device by micro-texturing one or more device surfaces. While this allows to somewhat increase the light path length and thus improve absorption compared to a non-textured device, a significant portion of the light may still escape from the device without being fully absorbed. It is therefore an object of this invention to provide an improved optical structure that can be used in conjunction with light harvesting devices and that can provide efficient light trapping with minimal energy loss.

Luminescent concentrators are also found in the industry for trapping incident radiation in a light guide by absorbing and re-radiating it in the form of scattered light at a longer wavelength using luminescent centers distributed in the volume of the light guide. However, because of the scattered nature of the reradiated light, only a portion of it can become trapped in the light guide by the total internal reflection, while the rest of the light escapes from the light guide. Furthermore, the luminescent centers can absorb or scatter already trapped light thus making the light guide less transparent and less efficient.

The present invention solves the above problems by providing a transparent optical cover structure having one or more micro-structured surfaces that allow for trapping the incident light within the light harvesting device by means of at least TIR and cause the multiple passage of the trapped light through the active layer thus improving the light absorption and device efficiency at the minimum consumption of active layer's material. Other objects and advantages of this invention will be apparent to those skilled in the art from the following disclosure.

BRIEF SUMMARY OF THE INVENTION

The present invention solves a number of light harvesting problems within a compact system utilizing efficient light deflection and trapping mechanisms. An optically transparent layer is provided which can be placed on top of a light harvesting device and enhance the useful light absorption in the device. The transparent layer employs light deflecting elements that communicate incident light a sufficiently high bend angle within the layer allowing for TIR at its light input surface and increasing the optical path length of light rays through the photoabsorptive layer of the light harvesting device.

In at least one embodiment, the present invention describes an optical cover which deflects light at a greater propagation angle with respect to a surface normal and traps said light by means of a total internal reflection which allows for increasing the light path length and for multiple passage of light through the photoabsorptive layer of a light harvesting device.

The optical cover includes a layer of optically transparent material having a broad light input surface and an opposing broad light output surface extending generally parallel to the light input surface. The transparent layer is configured for an unimpeded transversal light passage in the direction from the light input surface towards the light output surface. The transparent layer includes a plurality of light deflecting elements distributed along the prevailing plane of the layer and having a cumulative aperture substantially smaller than the area of each of the broad surfaces. The light input surface is characterized by a stepped drop in refractive index outwardly from the transparent layer and by a critical angle of TIR. Each of the light deflecting elements is configured to receive light propagating between the input and output surfaces and bend the light to a greater propagation angle with respect to a normal to the light input surface. The propagation angle of the deflected light with respect to the surface normal is advantageously selected to be greater than the TIR angle characterizing the light input surface.

The optical cover operates in response to light received on the light input surface of the optically transparent layer. At least a substantial portion of light received by the apertures of light deflecting elements is deflected from the original propagation path at a greater propagation angle allowing for TIR from the light input surface. As light enters a light harvesting device adjacent to the light output surface, an unabsorbed portion of light reflecting from the front surface or any of the internal layers or surfaces of the light harvesting device is reflected by the light input surface by means of TIR. This effectuates recycling of light that cannot be absorbed in a single pass through the photoabsorptive layer of the light harvesting device.

In at least one implementation, the light deflecting elements comprise surface relief elements. In at least one implementation, the light deflecting elements comprise microscopic surface cavities. In at least one implementation, such cavities may have a V-shape in a cross-section.

In alternative implementations, the light deflecting elements comprise surface relief features that can be configured in different ways. Particularly, the surface relief features can be selected from the group of elements consisting of prismatic grooves, blind holes, through holes, undercuts, notches, surface discontinuities, discontinuities in said layer, surface texture, and surface corrugations.

In at least one implementation, each of the light deflecting elements comprises a surface inclined at an angle with respect to the light input surface and configured to deflect light by means of refraction or a total internal reflection. In at least one implementation, the inclined surface has a planar shape or profile. In at least one implementation, the inclined surface has a curved shape or profile.

In at least one implementation, the optical cover comprising a plurality of light collectors distributed along the prevailing plane of the transparent layer. The light collectors are preferably distributed according to the same pattern as the plurality of light deflecting elements and pairwise form individual opticules with the respective light deflecting elements. Each light deflecting element is disposed on the optical axis of the respective light collector and in the immediate proximity to the focal area of the collector within each individual opticule. In at least one implementation, the optical cover comprises a lens array including a plurality of surface relief features disposed in the focal plane of the array.

In at least one implementation, the optical cover comprising a lens array where each lens of the array has a shape in a longitudinal section selected from the group of elements consisting of elongated, cylindrical, square, rectangular and hexagonal.

In at least one implementation, the optical cover comprises one or more optical cladding layers.

In at least one implementation, the optical cover further comprises one or more light harvesting devices disposed along the light output surface. In at least one implementation, the light harvesting device is selected from the group of elements consisting of one or more photovoltaic cells, radiation detectors, light absorbers, photo-chemical reactors and photo-bioreactors.

In at least one implementation, the optical cover has a form of a flexible sheet or film and can be bent to any suitable shape.

The present invention provides a number of beneficial elements which can be implemented either separately or in any desired combination without departing from the present teachings.

An element of the invention is an apparatus for collecting light over a given area and traveling in a generally transversal direction with respect to the light collection area.

Another element of the invention is the inclusion of an optically transparent layer having opposing light input and output surfaces and configured for an unimpeded light passage through its body at least in a transversal direction with respect to the either surface.

Another element of the invention is the inclusion of distributed light deflecting elements within the interior of the transparent layer which increase the propagation angle with respect to a surface normal without reversing the prevailing direction of light propagation through the transparent layer.

Another element of the invention is the use of light deflecting elements comprising a face containing both a reflective and transmissive surface for redirecting the light in relation to a normal to the prevailing plane of the transparent layer.

Another element of the invention is the use of deflecting elements formed in either light input or light output surface of the optically transparent layer.

Another element of the invention is the use of an array of light focusing elements which collect and focus the incident light onto the respective deflecting elements.

Another element of the invention is the use of an array of deflecting and/or focusing elements which span the surface of the device, or a portion thereof.

Another element of the invention is the arrangement of the respective pairs of the light focusing elements and the light deflecting elements into individual opticules which can operate independently from the other opticules.

Another element of the invention is an optical cover configured with an attached optically responsive device (e.g., photovoltaic cell or photo reactor).

Further elements of the invention will be brought out in the following portions of the specification, wherein the detailed description is for the purpose of fully disclosing preferred embodiments of the invention without placing limitations thereon.

BRIEF DESCRIPTION OF THE SEVERAL VIEWS OF THE DRAWING(S)

The invention will be more fully understood by reference to the following drawings which are for illustrative purposes only:

DETAILED DESCRIPTION OF THE INVENTION

Referring more specifically to the drawings, for illustrative purposes the present invention is embodied in the apparatus generally shown in the preceding figures. It will be appreciated that the apparatus may vary as to configuration and as to details of the parts without departing from the basic concepts as disclosed herein. Furthermore, elements represented in one embodiment as taught herein are applicable without limitation to other embodiments taught herein, and in combination with those embodiments and what is known in the art.

A wide range of applications exist for the present invention in relation to the collection of electromagnetic radiant energy, such as light, in a broad spectrum or any suitable spectral bands or domains. Therefore, for the sake of simplicity of expression, without limiting generality of this invention, the term "light" will be used herein although the general terms "electromagnetic energy", "electromagnetic radiation", "radiant energy" or exemplary terms like "visible light", "infrared light", or "ultraviolet light" would also be appropriate.

Figure 1:
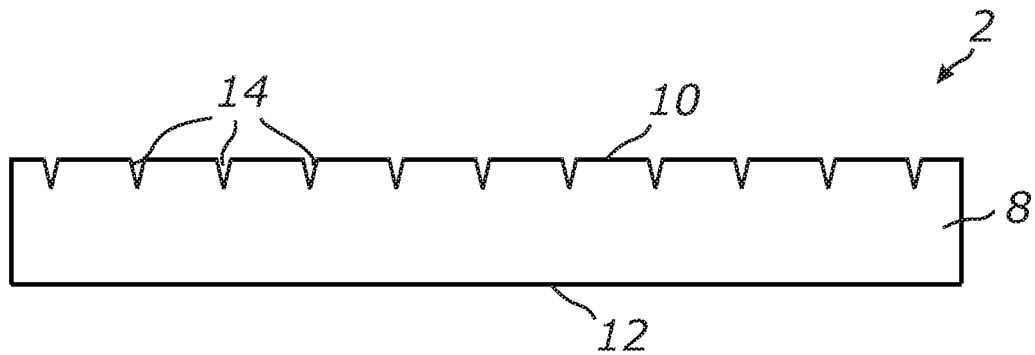
FIG. 1 is a cross-sectional view of an optical cover according to at least one embodiment of the present invention.

FIG. 1 illustrates the present invention and shows a cross-sectional view of an embodiment of a light trapping optical cover 2. Optical cover 2 comprises a layer 8 of essentially transparent refractive material confined between broad surface 10 and an opposing broad surface 12. Both surfaces 11 and 12 are broadly extending both longitudinally and laterally so that the thickness of transparent layer 8 is substantially smaller compared to its other two dimensions.

Both surfaces 10 and 12 are also essentially smooth and transparent and are configured for a good optical transmission in either direction. Layer 8 is configured for a generally unimpeded light passage through its body in either direction. Particularly, layer 8 should allow for an unimpeded light passage of light through any parts of the layer in the transversal direction. Layer 8 should also be sufficiently transparent and allow light to travel considerable distances within the layer along the layer's prevailing plane.

Optical cover 2 is generally designed to be laid flat on top of a light harvesting device (not shown in FIG. 1) where either one of surfaces 10 and 12 can be designated to be a light input surface facing the light source while the other surface can be designated to be a light output surface facing the light harvesting device. In operation, cover 2 and the underlying light harvesting device may be positioned with their prevailing surface planes perpendicular to the light source direction. However, they may also be designed to operate at any angle other than normal.

The refractive material of layer 8 should be high enough so that when optical cover 2 is coupled to a light harvesting device, the light input surface of layer 8 can form an optical interface characterized by a stepped drop in refractive index outwardly from said layer. It will be appreciated by those skilled in the art of optics that when referring to light or other waves passing through a boundary formed between two different refractive media, such as air and glass, the ratio of the sines of the angles of incidence and of refraction is a constant that depends on the ratio of refractive indices of the media. Referring to the refractive medium of layer 8 and the outside medium immediately adjacent to the light input surface, it will be appreciated that the following relationship can describe light bending properties of the optical interface formed by the light input surface: $n_1 \sin \phi_1 = n_2 \sin \phi_2$, where $n_1$ and $n_2$ are the refractive indices of the material of layer 8 and the outside medium, respectively, and $\phi_1$ and $\phi_2$ are the respective propagation angles that light makes in respect to the surface normal. It will be further appreciated that, in respect to the light internally striking the light input surface from layer 8, the same optical interface can also be characterized by the angle of a Total Internal Reflection (TIR) which is the value of $\phi_2$ for which $\phi_1$ equals 90°. A TIR angle $\phi_{TIR}$ can be found from the following expression:

$\phi_{TIR} = \arcsin(n_2/n_1 \cdot \sin 90°) = \arcsin(n_2/n_1)$. In an exemplary case of the interface between glass with the reflective index $n_1$ of about 1.51 and air with $n_2$ of about 1, $\phi_{TIR}$ is approximately equal to 41.47°.

Layer 8 comprises a plurality of light deflecting elements 14 within the boundaries formed by surfaces 10 and 12. Light deflecting elements 14 are spaced apart from each other and distributed along the prevailing plane of cover 2. Each light deflecting element 14 has a substantially smaller aperture than the light receiving aperture of optical cover 2. Furthermore, the aperture of each light deflecting element 14 is preferably smaller than the adjacent spacing area so that the plurality of light deflecting elements 14 cumulatively occupies a sufficiently small area compared to either surfaces 10 and 12.

According to an aspect of the present invention, it is preferred that each light deflecting element 14 is configured to communicate a generally greater bend angle to light propagating between surfaces 10 and 12 compared to the case when light passes through layer 8 simply by crossing surfaces 10 and 12 and without striking any light deflecting element 14. Each light deflecting element 14 should preferably be configured to alter the ordinary light path between surface 10 and 12 yet providing for an unimpeded passage of incident light through layer 8.

By way of example and not limitation, light deflecting elements 14 may be configured to receive light incident onto the light input surface of layer 8 at normal angles (which corresponds to zero incidence angles with respect to a surface normal) and deflect it at an angle greater than TIR angle $\phi_{TIR}$ with respect to the surface normal. In a further non-limiting example, each light deflecting element 14 may be configured to receive a fan of rays having a predefined angular spread and deflect each ray from the original propagation path so that at least a substantial part of deflected light rays continues propagating through layer 8 but at generally greater propagation angles with respect to a normal to the prevailing plane of the layer. Similarly, it may be preferred that the new propagation angles, after deflection, are greater than TIR angle $\phi_{TIR}$ at the optical interface formed by the light input surface of layer 8. Accordingly, when surface 10 is designated as the light input surface, at least a substantial portion of light deflected by each element 14 should be communicated a propagation angle greater than the TIR angle at the boundary formed by surface 10. When surface 12 is the light input surface, the propagation angle of the deflected light should be generally greater than the TIR angle at the boundary formed by that surface.

Let's define a propagation angle $\phi_D$ being the angle that a light ray makes with respect to a normal to the prevailing plane of layer 8 and, consequently, of optical cover 2. Let's further define angle $\phi_D$ as being counted off from a reference direction along said normal which indicates the prevailing direction of light propagation through optical cover 2. For example, when surface 10 of is the light input surface and surface 12 is the light output surface of layer 8, the prevailing propagation direction will be the direction from surface 10 to surface 12 along the surface normal. Likewise, when surface 12 is receiving light and surface 10 is the opposing light output surface, the prevailing direction of light propagation through cover 2 will be the direction from surface 12 to surface 10 along a surface normal. It will be appreciated that, when surfaces 10 and 12 are parallel to each other, a normal to one of the surfaces will also be a normal to the other surface and to the prevailing plane of layer 8 and cover 2. It will further be appreciated that, in accordance with the above definitions, propagation angle $\phi_D$ may take values from 0° to 180°.

According to a preferred embodiment of the present invention, light deflecting elements 14 are designed to result in the propagation angle $\phi_D$ being greater than TIR angle $\phi_{TIR}$ at the optical interface formed by the light input surface of layer 8 and less than 90°. This ensures that the light deflection by elements 14 will not prevent light from reaching the light output surface yet providing for a substantial light deviation from the original propagation path and enabling TIR at the light input surface of layer 8. By using the above notations for the refractive indices, a preferred propagation angle $\phi_D$ of light deflected by light deflecting elements 14 may thus be expressed by the following relationship: $\arcsin(n_2/n_1) < \phi_D < 90°$.

In FIG. 1, light deflecting elements 14 are exemplified by high aspect ratio prismatic cavities formed in broad surface 10. Each of the high aspect ratio prismatic cavities may be characterized by two generally planar and symmetrically disposed faces located between surfaces 10 and 12 and inclined at an angle with respect to both surfaces. In at least some embodiments of the present invention and in the context of describing a surface microstructure element, such as, for example, a surface cavity having a prismatic or conical shape, the term "high aspect ratio" is meant to mean a geometric configuration of the microstructure element, in a cross-section, where the height or depth of the microstructure element is approximately equal or greater than its base at the surface. This term also includes the case when the height of the microstructure element is much greater than the base thus corresponding to a deep drawn cavity or a hole with almost vertical walls.

According to an embodiment of the present invention illustrated in FIG. 1, an individual light deflecting elements 14 can be viewed as any suitable localized interruption or alteration of the otherwise smooth surface 10 that alters the optical interface properties of the surface in such a way that a fan of rays entering layer 8 through any element 14 will have a different angular distribution in at least one dimension within layer 8 compared to the case when the same fan of rays crosses surface 10 elsewhere through spacing areas between elements 14. In an aspect of this invention, light deflecting elements 14 suppress the normal Snell's law refraction generally characterizing the broad surface 10. It will be appreciated that light deflecting elements 14 alter the surface properties only within their active apertures while the rest of the surface area remains unaffected.

It will be appreciated that the cross-sectional view of FIG. 1 can represent different basic configurations and structures of optical cover 2. By way of example, one such structure may have a linear or lenticular geometry as it can be visually represented by the extrusion of the above cross-section in the direction perpendicular to the drawing or by a revolution of the cross-section around a vertical axis disposed in the plane of the drawing.

Figure 2:
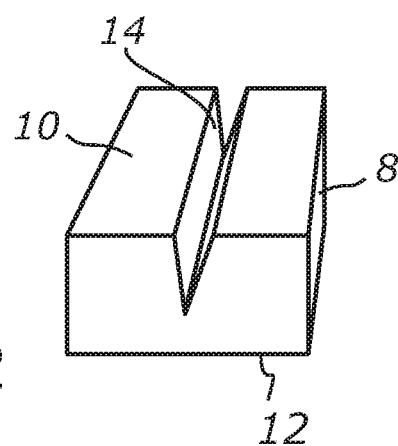
FIG. 2 is a schematic perspective view of an optical cover portion showing a light deflecting element shaped as an elongated V-groove, according to at least one embodiment of the present invention.
Figure 3:
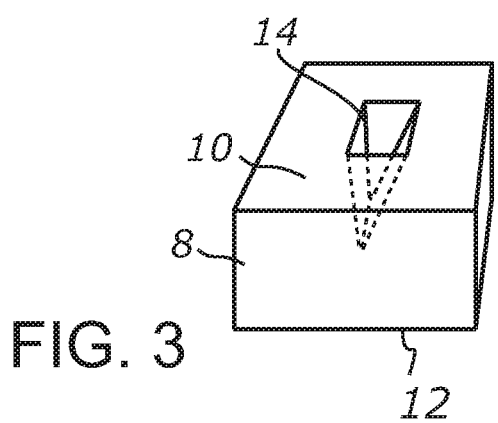
FIG. 3 shows another example of a light deflecting element comprising a prismatic cavity, according to at least one embodiment of the present invention.
Figure 4:
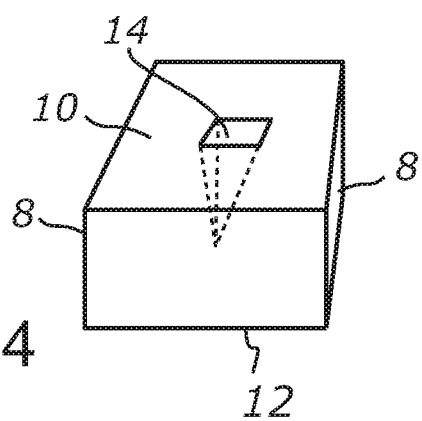
FIG. 4 shows a further example of a surface relief feature comprising a pyramidal cavity, according to at least one embodiment of the present invention.
Figure 5:
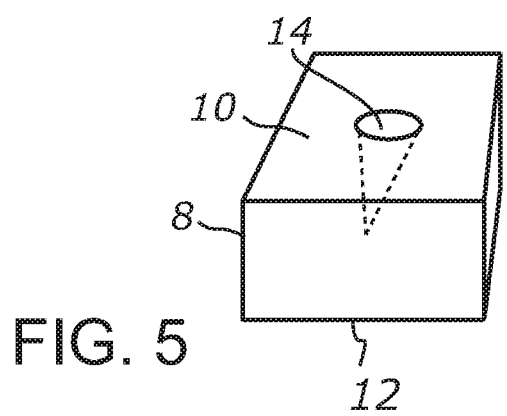
FIG. 5 shows a yet further example of a surface relief feature comprising a conical cavity, according to at least one embodiment of the present invention.

FIG. 2 through FIG. 5 illustrate various configurations of light deflecting elements 14 which may be represented by a V-shaped cross-section. Particularly, FIG. 2 shows a deep and elongated V-groove which may extend all the way through surface 10 or its substantial portion. FIG. 3 shows a relatively short V-groove or a notch which can still have an elongated shape or, alternatively, it can have identical or similar longitudinal and transversal dimensions. FIG. 4 shows a pyramidal shape of the cavity representing an individual light deflecting element 14. FIG. 5 shows a cone-shape cavity of light deflecting element 14. While straight cross-sectional profiles of the walls formed by the surface cavities have been illustrated, it should be understood that any curved and/or segmented profiles may also be used to form the respective elements 14.

Figure 6:
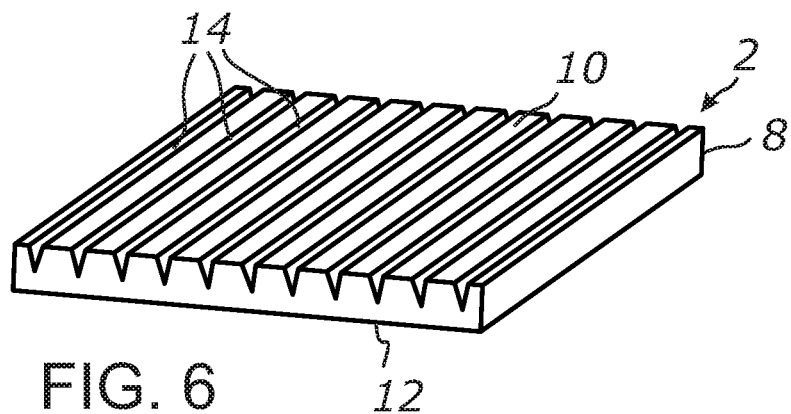
FIG. 6 is a schematic perspective view of an optical cover comprising a plurality of V-shape prismatic grooves in a cylindrical configuration, according to at least one embodiment of the present invention.
Figure 7:
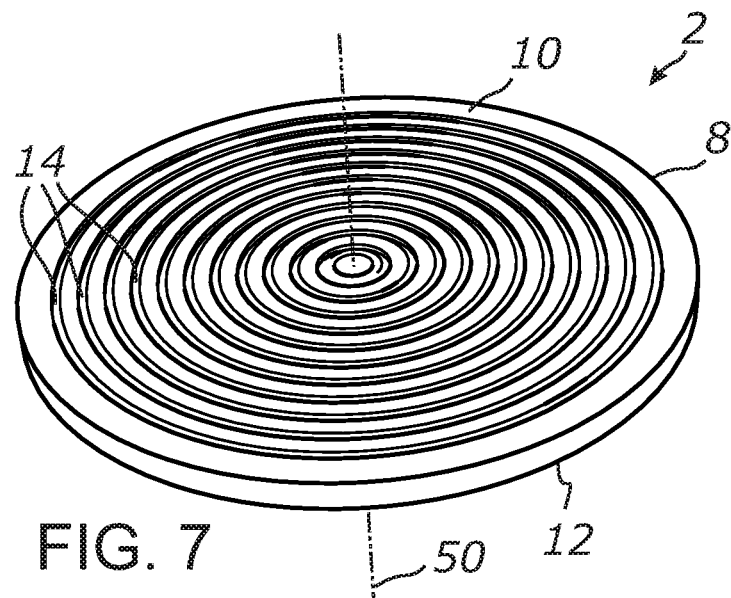
FIG. 7 is a schematic perspective view of an optical cover comprising a plurality of V-shape grooves in an axisymmetrical configuration, according to at least one embodiment of the present invention.

By way of example and not limitation, FIG. 6 and FIG. 7 illustrate variations of optical cover 2 having a cross-section shown in FIG. 1 and where light deflecting elements 14 have a linear configuration. In FIG. 6, a rectangular sheet of layer 8 employs an array of high aspect ratio lenticular prismatic grooves formed in surface 10. Each prismatic groove represents an individual light deflecting element 14. Elements 14 are spaced apart from each other and are alternating with smooth spacing areas of surface 10. In FIG. 7, the lenticular prismatic grooves of elements 15 have an annular geometry and are formed in layer 8 which has a round shape resulting in an axisymmetrical configuration of optical cover 2 with an axis of symmetry 50.

Figure 8:
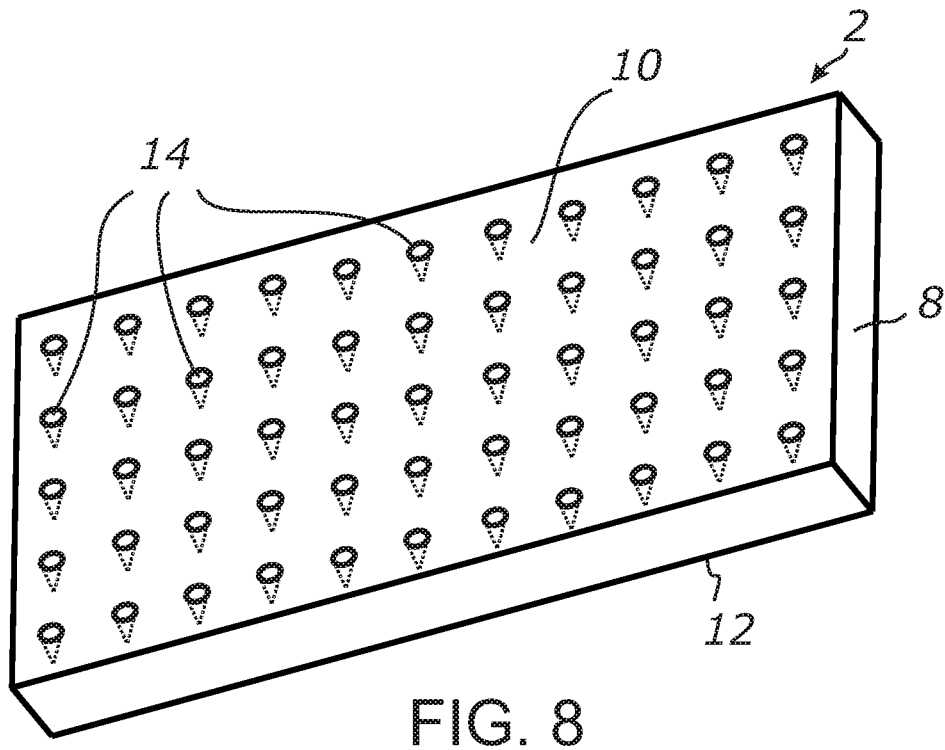
FIG. 8 is a schematic perspective view of an optical cover comprising a plurality of discrete light deflecting elements formed by surface cavities, according to at least one embodiment of the present invention.
Figure 9:
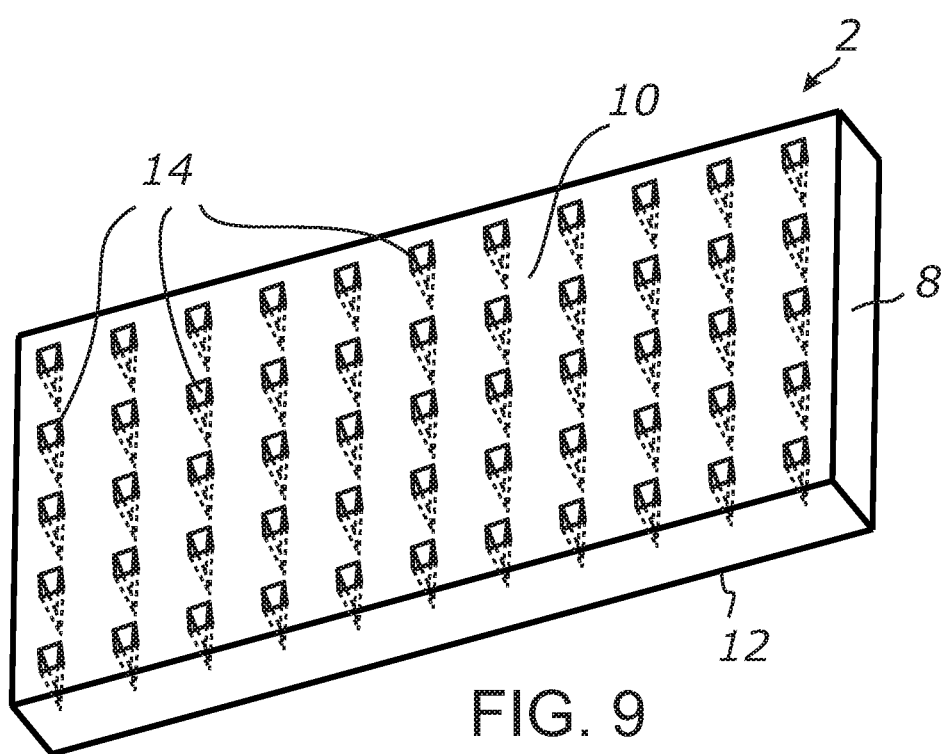
FIG. 9 is a further example of light deflecting elements employing another-shape cavities, according to at least one embodiment of the present invention.

FIG. 8 and FIG. 9 further illustrate possible variations of optical cover 2 having a cross-section shown in FIG. 1 and where surface cavities of light deflecting elements 14 are discrete surface relief features formed in surface 10 and distributed along the width and length of rectangularly shaped layer 8. Each deflecting element 14 represents an interruption in otherwise smooth and planar surface 10 and locally alters light bending properties of the surface according to the principles described above. In FIG. 8, light deflecting elements 14 are formed by a two-dimensional array of high-aspect-ratio conical cavities distributed according to a predetermined pattern across surface 10 of layer 8. Each conical cavity may have a round or elongated/elliptical aperture. In a further example shown in FIG. 9, light deflecting elements 14 are represented by prismatic or pyramidal cavities each having a rectangular aperture.

It should be understood that deflecting elements 14 formed by a discrete surface microstructural features, such as V-shaped notches or cuts, may be arranged in groups or any suitable patterns. By way of example, V-notches may be positioned adjacent to each other in one dimension forming one or more parallel bands extending along the length or width of surface 10 where the notches can be made either parallel or perpendicular to the bands.

Figure 10:
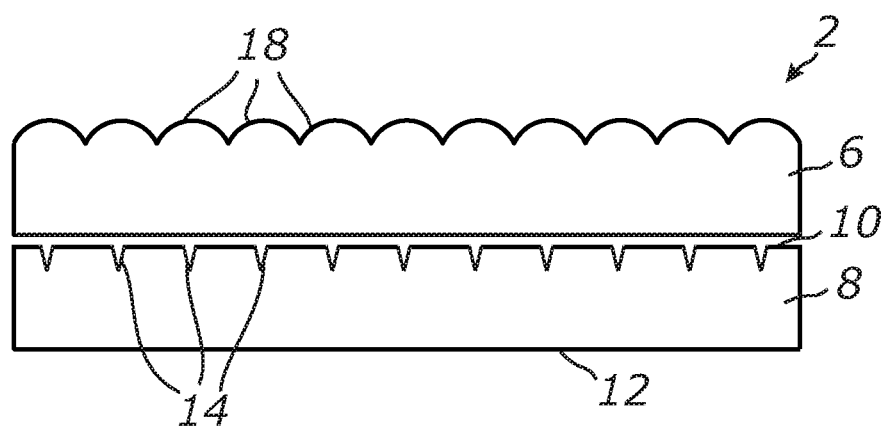
FIG. 10 is a schematic perspective view of an optical cover comprising cavities or V-grooves and further employing a lens array, according to at least one embodiment of the present invention.

Optical cover may further comprise a light collector array exemplified by a planar lens array 6 in FIG. 10. Lens array 6 is formed by an array of convex micro lenses 18 arranged on a common transparent substrate. Lens array 6 is positioned so that its side covered with lenses 18 is facing the intended source of light and the opposite side or surface is disposed adjacent to surface 10 of layer 8 with a small gap. The sheetform and dimensions of planar lens array 6 are selected to match that of layer 8. A sandwich of lens array 6 and layer 8 can thus form a transparent layered sheet structure where lens array 6 represents a front sheet and layer 8 represents a back sheet with its surface 10 being designated as the light input surface and surface 12 being designated as the light output surface.

It should be understood that the thickness of both lens array 6 and layer 8 may be varied in a broad range including the thicknesses more typical for a plate, sheet, or film which, in turn, will determine the suitable fabrication techniques, materials, physical properties, feel and appearance of optical cover 2. In the embodiment of FIG. 10, a small air gap is provided between layers formed by lens array 6 and layer 8 to optically separate the layers from each other by providing a stepped drop in refractive index outwardly from layer 8 at surface 10.

The number and disposition of individual lenses 18 in lens array 6 are selected to match those of light deflecting elements 14 in layer 8 so that there is a one-to-one relationship between lenses 18 and elements 14. More particularly, each light deflecting element 14 is preferably aligned with respect to the optical axis of the respective lens 18. Furthermore, the optical and dimensional parameters of lenses 18 are selected so that each light deflecting element 14 is disposed at or near the focal area or focus of the respective lens 18. As a practical consideration, the focal length of lenses 18 is selected to be approximately equal or slightly longer than the thickness of lens array 6 so that each lens 18 is designed to have a focus located outside of the lens array itself, preferably at a small pre-determined distance from the lens array. Among the factors that will determine the preferred focal distance are the thickness of the air gap between lens array 6 and layer 8 and the size of the cavities forming elements 14.

Accordingly, when positioned with one side representing the entrance aperture perpendicular to the incident beam, lens array 6 provides a plurality of foci on the opposite side, the foci being spaced apart from each other in accordance with the spacing of individual lenses in the lens array. With the lens array being planar and individual lenses having an identical optical configuration, the plurality of foci of individual lenses 18 provides a common focal plane disposed at a small predetermined distance from lens array 6. The entrance aperture of each light deflecting element 14 is selected to be substantially smaller than that of the respective lens 18 and to have the size approximately equal or slightly larger than the focal area of the lens.

For the purpose of illustration of this invention and from the practical standpoint, the terms "focal area" or "focus" of an individual lens 18 of focusing lens array 6 should be understood broadly and generally refers to an area within the envelope of the focused beam which said lens may form when exposed to an incident beam of light, where said area has a cross section substantially smaller than the cross section of respective lens 18. Accordingly, the focal area may include areas at a relatively small distance from the "ideal" focus of the lens 18 and where the focused beam can be convergent (before focus) or divergent (after focus). The term "effective focal length" or "effective focal distance" can be defined as the distance from the vertex of lens to its focus.

Each pair of light deflecting elements 14 and lenses 18 is thus forming a combined optical element that we hereinafter generally associate with the term "opticule". In the context of the present invention and referring to arrays of optical micro-components, we define the term "opticule" as an elementary combination of a larger-aperture primary focusing optical component and an associated smaller-aperture secondary optical component disposed in the primary's focus and designed to further redirect or redistribute light collected by the primary component. However, this term should be understood loosely and should not be interpreted as limiting the scope of the present invention in any way.

Figure 11:
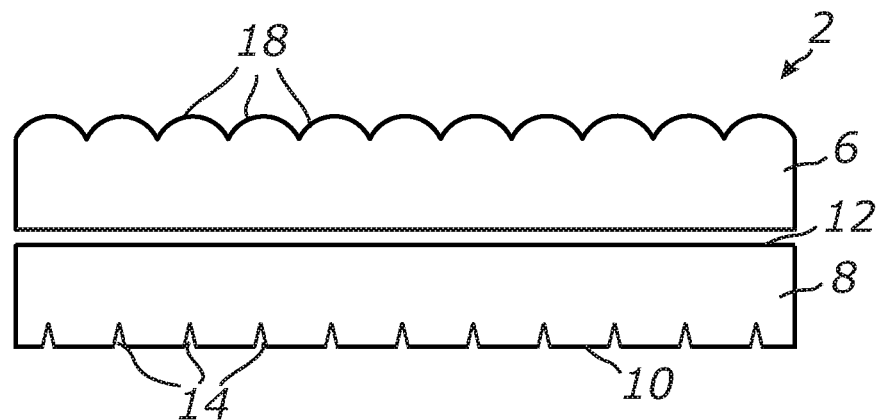
FIG. 11 is a schematic perspective view of an optical cover with a different disposition of cavities or V-grooves with respect to a lens array, according to at least one embodiment of the present invention.

FIG. 11 shows an alternative disposition of lens array 6 with respect to layer 8 where lens array 6 is positioned adjacent to surface 12 which is opposing to surface 10 having light deflecting elements 14 and where surface 10 is designated as the light output surface and surface 12 is designated as the light input surface of layer 8. In this case, the focal length of each lens 18 should be adjusted compared to the embodiment of FIG. 10 to accommodate the thickness of layer 8 and the increased distance between lenses 18 and light deflecting elements 14. Similarly, each pair of lens 18 and deflecting element 14 forms an opticule which may operate independently from the other opticules.

Lens array 6 can be formed, for example, by an array of cylindrical or point-focus lenses depending on the configuration of layer 8 and light deflecting elements 14. Lenses 18 may have a linear, or linear-focus, geometry providing light focusing in one dimension, particularly in the case when optical cover 2 employs a linear configuration of light deflecting elements 14. Alternatively, each lens 18 may have a point-focus geometry and can be configured for focusing the incident light in two dimensions, particularly in the case when the array of light deflecting elements 14 is configured in a two-dimensional pattern of discrete surface relief elements. However, it should be understood that lenses 18 forming the lens array 6 can be made in any other desired configuration which provides for concentration of the received light, including but not limited to lenticular, cylindrical, round, hexagonal, square, rectangular, linear-focus or point-focus configurations or shapes. Lenses 18 can be arranged to cover the entire area of the lens array 6 or they can be spaced apart from each other leaving one or more portions of the lens array void of the lenses.

It will be appreciated that the individual opticules each comprising light deflecting element 14 and matching lens 18 can be disposed according to any suitable pattern throughout the prevailing plane of optical cover 2 and can be packed with any desired density covering a portion or the entire light receiving aperture of optical cover 2. In a non-limiting example, a plurality of opticules can be distributed along surface 10 as a uniform array or they can be arbitrary grouped into two or more arrays which may or may not overlap and which may also have different suitable arrangements of the opticules within them.

Figure 12:
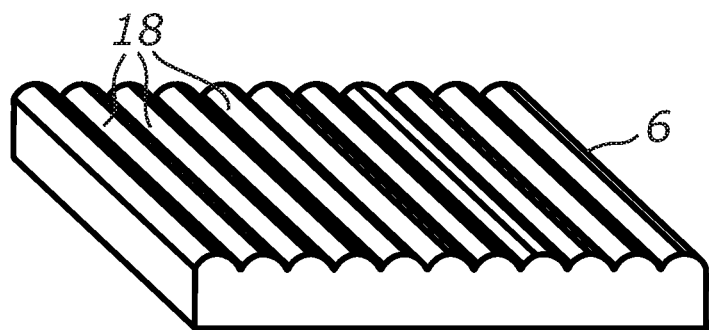
FIG. 12 is a schematic perspective view of a rectangular lens array employing cylindrical (linear-focus) lenses, according to at least one embodiment of the present invention.
Figure 13:
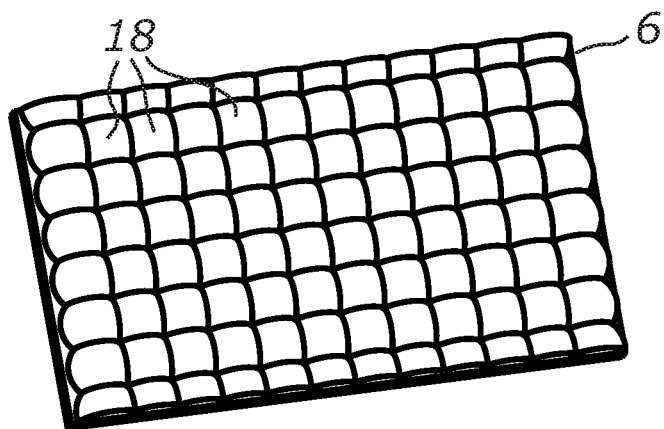
FIG. 13 is a schematic perspective view of a rectangular lens array employing square-shaped point-focus lenses, according to at least one embodiment of the present invention.
Figure 14:
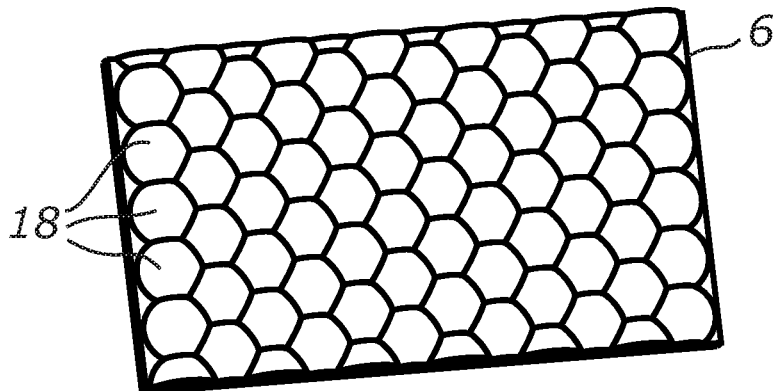
FIG. 14 is a schematic perspective view of a rectangular lens array employing hexagon-shaped point-focus lenses, according to at least one embodiment of the present invention.

According to an aspect of the present invention, FIG. 12 illustrates an exemplary configuration of lens array 6 in a lenticular configuration employing cylindrical lenses. This configuration advantageously corresponds to the lenticular configuration of layer 8 shown in FIG. 6. According to a further aspect of the present invention, FIG. 13 illustrates a densely packed lens array 6 which correspond to either configuration of layer 8 shown in FIG. 8 and FIG. 9. Each point focus lens 18 has a square aperture which allows to cover about 100% of the lens array surface. FIG. 14 shows an alternative hexagonal shape for the apertures of lenses 18.

Figure 15:
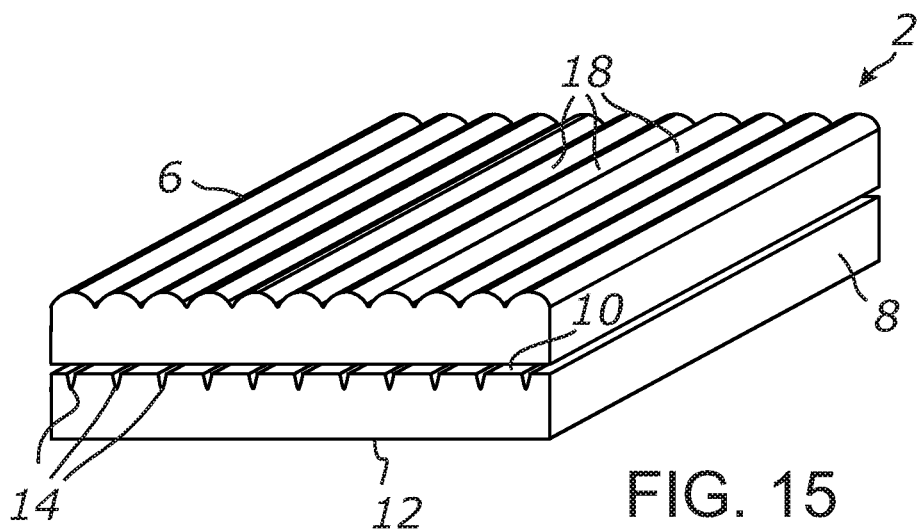
FIG. 15 is a schematic perspective view of an optical cover illustrating an exemplary lenticular configuration employing a planar transparent layer and a lens array, according to at least one embodiment of the present invention.

FIG. 15 shows an embodiment of optical cover 2 comprising rectangular layer 8 having light deflecting elements 14 in the form of high-aspect-ratio prismatic grooves and further comprising lens array 6 positioned adjacent to surface 10 of layer 8 with a small air gap. Lens array 6 has a plurality of lenses 18 disposed in optical alignment with respective light deflecting elements 14 so that each element 14 is disposed in light receiving relationship with respect to a matching lens 18. While only a few opticules are shown in FIG. 15 for the sake of clarity, it should be understood that optical cover 2 may ordinarily comprise a relatively large number of micro-scale lenses 18 and light deflecting elements 14. By way of example and not limitation, the thickness of the resulting structure may range from a fraction of a millimeter (a film-like configuration) up to several millimeters (a sheet-like or plate-like configuration) and the width and/or length of the structure may range from 100 mm to 1,000 mm or more.

Figure 16:
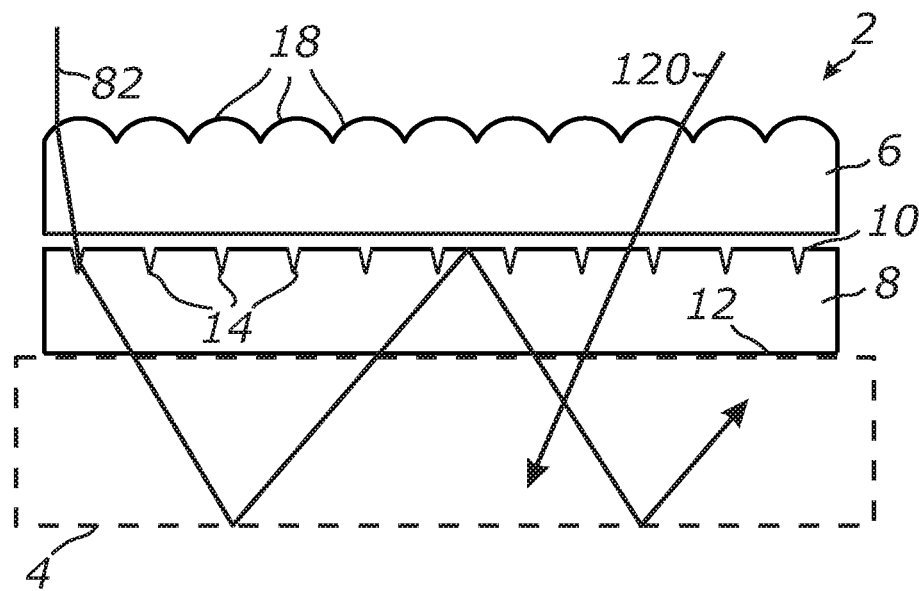
FIG. 16 is a schematic cross-sectional view of an optical cover illustrating its operation in conjunction with a light harvesting device, according to at least one embodiment of the present invention.

In FIG. 16, an embodiment of optical cover 2 is illustrated in operation with a light harvesting device 4. Each light deflecting element 14 is configured in the form of a prismatic groove having a high geometrical aspect ratio in a cross-section perpendicular to the longitudinal axis of the groove. Each lens/groove pair forms an individual opticule which is capable of inputting at least the on-axis incident light into layer 8 at an angle which is more favorable for light trapping. Optical cover 2 is positioned on top of light harvesting device 4 and in a direct contact with the light receiving surface of the device so that there is a good optical coupling contact between light output surface 12 and device 4 to provide for an unimpeded light passage from layer 8 into device 4. It may also be preferred that the refractive index of layer 8 is less than or approximately matches that of device 4 to reduce parasitic reflections at the boundary between cover 2 and device 4. A layer of index-matched optical adhesive or encapsulant (not shown) may also be provided between optical cover 2 and device 4 in order to further promote the optical contact and surface-to-surface adhesion.

Referring to FIG. 16, a ray 82 strikes one of the lenses 18 of lens array 6 and is further directed to a matching light deflecting element 14 by means of focusing. Ray 82 further strikes an inclined surface of the V-shaped groove forming the light deflecting element 14 which communicates a greater bend angle to the ray with respect to a normal to surface 10. The groove configuration and the refractive index of layer 8 are so selected as to result in ray 82 deflection to a new propagation angle which is greater than TIR angle $\phi_{TIR}$ at surface 10.

Ray 82 further crosses surface 12 of layer 8 and enters light harvesting device 4. Since there is a good optical coupling contact between layer 8 and device 4, the losses at the respective optical interface are negligible. While ray 82 is propagating in the bulk material of light harvesting device 4, at least a portion of its energy is absorbed and converted to whatever useful type of energy. It will be appreciated that since the incidence angle of ray 82 into the layer of device 4 is increased compared to the original normal incidence, the optical path of the ray through the photosensitive material is also increased resulting in enhanced absorption. Yet, when the photosensitive layer of device 4 is relatively thin, a portion of ray 82 may still emerge back from device 4 into layer 8, for example, after reflecting from the device's reflective back cover by means of TIR or by means of a specular reflection. The emerging ray 82 will thus strike surface 10 from the inside of layer 8. Since the propagation angle of ray 82 with respect to a normal to surface 10 is greater than the TIR angle $\phi_{TIR}$, the ray is almost losslessly reflected from surface 10 at the same angle by means of TIR. Ray 82 can thus further enter device 4 where the rest of its energy can be absorbed. This process may continue until ray 82 is completely absorbed in device 4. Optical cover 2 therefore provides convenient means for recycling light which is not fully absorbed during its initial interaction with light harvesting device 4.

It should be understood that, a portion of ray 82 may be ejected from cover 2 into the environment when certain conditions are met. This can occur, for example, when ray 82 strikes any light deflecting element for the second time. However, since the area associated with light deflecting elements 14 is substantially smaller than that of surface 10, the probability of ray 82 striking another light deflecting element 14 before it gets substantially absorbed is fairly low, which ensures the effectiveness of light trapping and useful conversion. Ray 82 may also randomly obtain less-than-TIR propagation angles and exit from optical cover 2 due to scattering within layer 8 or device 4 due to various reasons such as optical imperfections of the material, surface roughness, etc. However, these effects may be minimized by selecting optical materials with sufficiently good optical clarity and good surface quality. Additionally, the back surface of the light harvesting device 4 may be provided with good specular reflectivity.

It should be understood that optical cover 2 may be configured to admit light from a broad angular range into device 4. Referring further to FIG. 16, a stray (off-axis) ray 120 strikes lens 18 of lens array 6 and is focused onto a smooth portion of surface 10 thus missing the corresponding light deflecting element 14. Ray 120 still passes through layer 8 and enters device 4 where at least a portion of it can be absorbed depending on the absorption properties and the thickness of the photosensitive material. However, since ray 120 has not been additionally bent by light deflecting element, its unabsorbed portion, if any, which can emerge from device 4 back into layer 8 will generally not be trapped by means of TIR and may escape from cover 2 into the environment.

Figure 17:
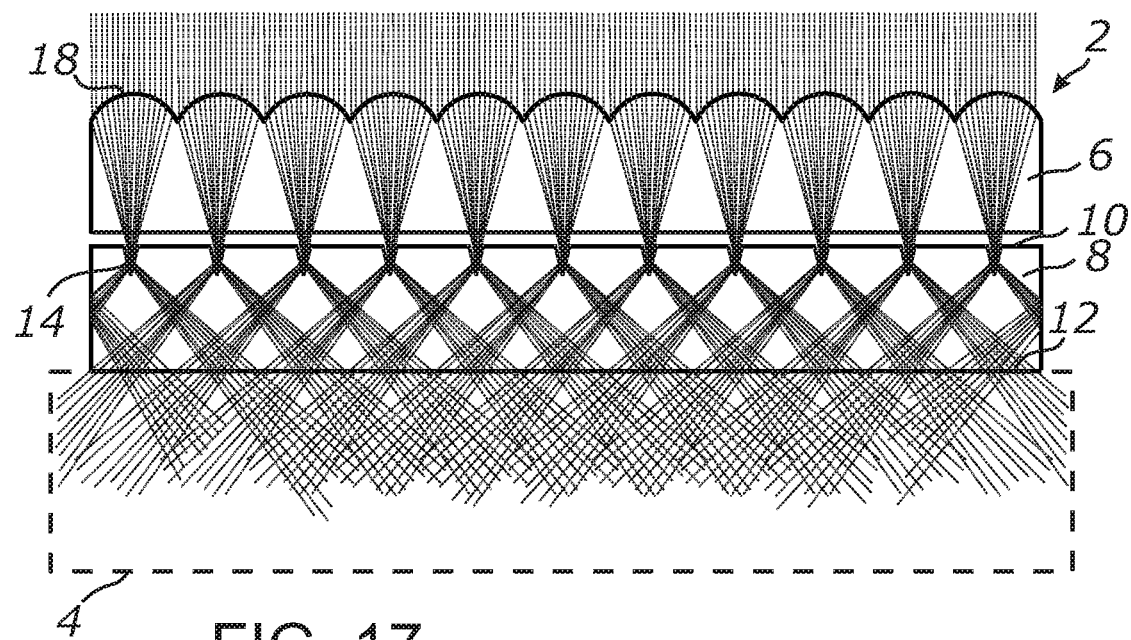
FIG. 17 is a schematic view, in a cross-section, and ray tracing of a light harvesting system employing an optical cover, according to at least one embodiment of the present invention.

In FIG. 17, an embodiment of optical cover 2 is further illustrated with more individual on-axis rays being shown. Each opticule acts an independent optical system injecting light into cover 2 and light harvesting device 4 at a greater bend angle compared to the unaltered surface 10. This results in slant propagation angles for most light rays in device 4 thus increasing the optical path through the light sensitive material and increasing the useful absorption. Additionally, the light trapping further enhances light absorption due to the TIR mechanism as explained above.

Figure 18:
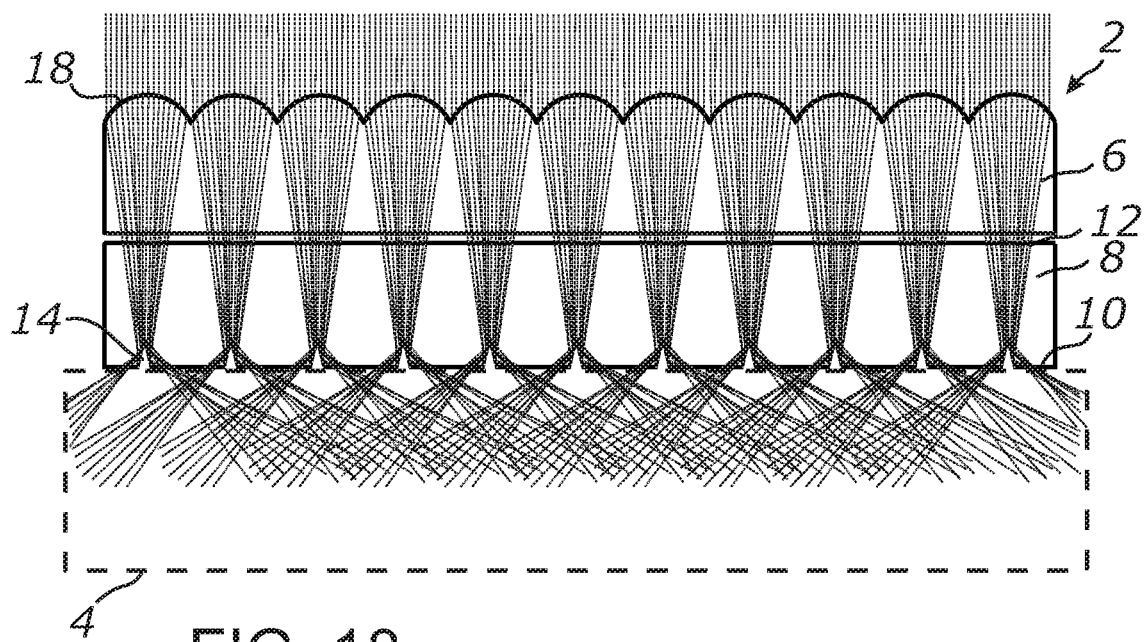
FIG. 18 is a schematic view, in a cross-section, and ray tracing of a light harvesting system employing an optical cover in an alternative exemplary configuration, according to at least one embodiment of the present invention.

FIG. 18 shows the operation of an alternative configuration of optical cover 2 in which layer 8 is flipped upside down so that surface 10 is facing device 4 and surface 12 is facing lens array 6. Surface 10 is therefore designated to operate as the light output surface and surface 12 becomes the light input surface of cover 2. As noted above with the reference to FIG. 11, the focal lengths of lenses 18 and/or the thickness of the respective layers should be selected accordingly to ensure that light deflecting elements 14 are positioned in the focal plane of lens array 6.

Referring to FIG. 18, a parallel beam of light, such as that emanated by a distant light source or the sun, strikes the entrance aperture of lens array 6. Lenses 18 focus the respective portions of the beam onto the plurality of light deflecting elements 14 which disperse the focused rays within layer 8 at greater angles with respect to the normal to the prevailing plane of the layer 8. The angular distribution of the dispersed light is such that at least a substantial part of the light rays obtains propagation angles allowing for TIR at the light input surface 12. The light which is injected into light harvesting device 4 becomes trapped within the sandwich structure formed by layer 8 and photo absorbing layer of device 4. The optical path and useful absorption of light by device 4 is thus increased due to both the high bend angles and light trapping due to TIR.

Figure 19:
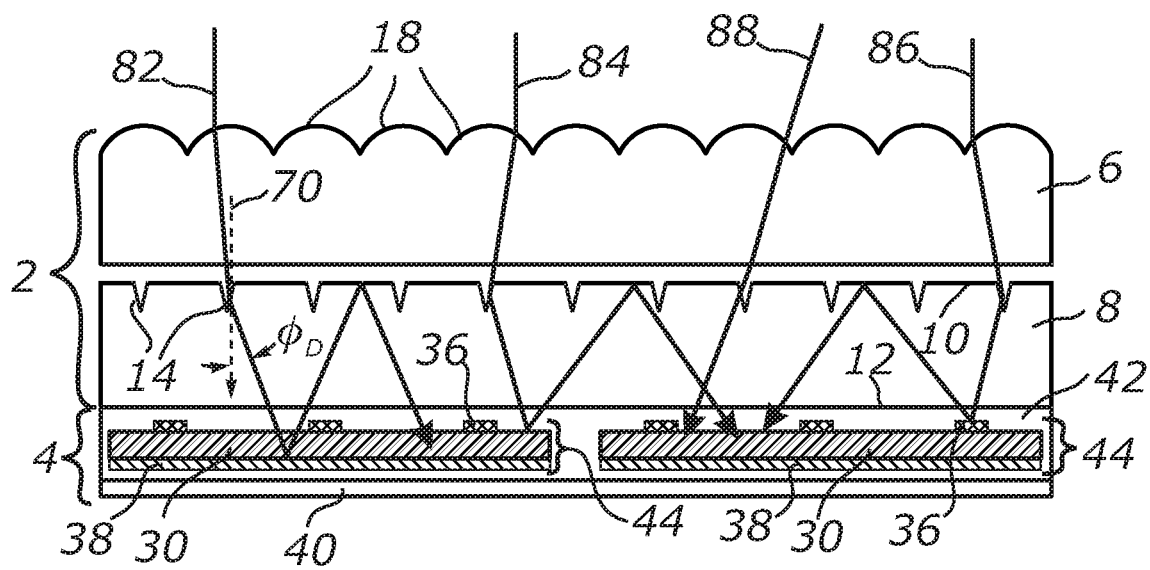
FIG. 19 is a schematic view, in a cross-section, and ray tracing of a sunlight harvesting system employing an optical cover and photovoltaic devices, according to at least one embodiment of the present invention.

FIG. 19 shows a more specific illustrative example of using cover 2 with a light harvesting device such as a photovoltaic panel or one or more photovoltaic cells for collecting the sunlight. As it will be seen from the below description, optical cover 2 can be effectively used for collecting both the direct and diffuse light. Also, while photovoltaic light harvesting elements are shown by way of example, it will be appreciated that the same principles can be applied for light collectors or detectors employing any other type of electronic light harvesting device.

In FIG. 19, optical cover 2 comprises transparent layer 8 and lens array 6. Layer 8 has opposing broad surfaces 10 and 12 and is configured for an unimpeded light passage in a broad range of incidence angles with respect to a normal to surface 10 which is designated as the light input surface. Light deflecting elements 14 are formed in surface 10 by high-aspect-ratio prismatic or conical grooves or cavities having a V-shaped cross-section. Light harvesting device 4 comprises one or more photovoltaic cells 44 each having a photo sensitive layer 30, multiple front contacts 36 and a metallic back contact layer 38. A customary layer of optically transparent encapsulant 42, such as EVA or silicone, can be provided for protecting and insulating the photovoltaic cells 44. Device 4 can also further employ a back cover 40 for protecting the photovoltaic components from the environment and/or for further enhancing the light trapping in the device.

In operation, a near-normal ray 82 is focused by lens 18 onto the respective light deflecting element 14 and is further directed through surface 12 into device 4 where it enters layer 30 of photovoltaic cell 44. In a non-limiting aspect, ray 82 can exemplify the direct sunlight or a beam of light from any other distant radiant energy source. The refractive faces of light deflecting elements 14 are inclined with respect to surface 10 so as to result in deflecting light rays and communicating them propagation angles greater than the TIR angle at surface 10. Particularly, at least one wall of the V-groove or cavity of element 14 is inclined at such an angle that the propagation angle $\phi_D$ of ray 82 with respect to a prevailing direction 70 of light propagation through optical cover 2 is less than 90° and greater than the TIR angle at surface 10 of layer 8.

Layer 30 at least partially absorbs the energy of ray 82 and the rest of ray 82 is reflected from back contact 38. The reflected portion of ray 82 escapes device 4 where it enters cover 2 and eventually strikes surface 10 from the inside of said layer. Ray 82 subsequently undergoes TIR at surface 10 and is directed back into photovoltaic cell 44 where the remaining energy of ray 82 is absorbed by layer 30.

Another on-axis ray 84 is similarly injected by a different opticule (a pair of lens 18 and deflecting element 14) into cover 2. In a non-limiting illustrative aspect of the invention, ray 84 can be reflected by the surface of photovoltaic cell 44. This can occur for a number of reasons, for example, due to the Fresnel reflection at the encapsulant/cell interface. In a more particular example, photovoltaic cell 44 can employ crystalline Si material, which refractive index is very high (about 3.5 at 0.55 µm wavelength) compared to the common optical materials such as glass or PMMA and the Fresnel reflection from its surface can be substantial. The reflected ray 84 exits light harvesting device 4 and enters optical cover 2 where it strikes surface 10. Again, the stepped drop in refractive index between layer 8 and the outside medium provides for TIR from surface 10 at the given incidence angle which ensures that 84 losslessly reflects from surface 10 and is directed back into device 4 where it is absorbed by the photosensitive/photoabsorptive layer 30 of the adjacent cell 44.

A yet another ray 86 entering light harvesting device 4 via optical cover 2 and bent by light deflecting element 14 to a greater-than-TIR angle strikes a contact finger 36 of photovoltaic cell 44. As shown in FIG. 19, ray 86 is reflected back into cover 2 without interacting with the photosensitive material 30. Without cover 2, ray 86 would have escaped into the environment without a chance of being absorbed. However, due to the structure of cover 2, ray 86 is kept within the system by means of TIR from surface 10 and is further directed toward photovoltaic cell 44. In view of the above illustrated examples, it will be appreciated that optical cover 2 acts as a light trapping superstructure on top of photovoltaic cells and allows for recycling the photons thus enhancing their absorption and conversion into electricity.

Referring further to FIG. 19, a stray light ray 88 enters optical cover 2 at a skew angle. Ray 88 may exemplify a diffuse ambient light or an off-axis light beam. Ray 88 interacts with lens 18 but can miss the respective light deflecting element 14 when the incidence angle is greater than the acceptance angle of the opticule. Since both lens array 6 and layer 8 are essentially transparent to the incident light, optical cover 2 still transmits ray 88 down to photovoltaic cell 44 where it can be either fully or partially absorbed. Additionally, each light deflecting element 14 may be configured so that when an off-axis ray strikes its refractive facets, it is still directed downward to light harvesting device 4. It will be appreciated that, if ray 88 is scattered anywhere between surface 10 of layer 8 and back cover 40 of light harvesting device 4, it can still be trapped by cover 2 if the resulting scattering angle with respect to a normal to surface 10 becomes less than the TIR angle. Thus, optical cover 2 allows for harvesting the ambient or diffuse light unlike optical concentrators which can only collect the direct light and usually send the off-axis rays away from the target.

Figure 20:
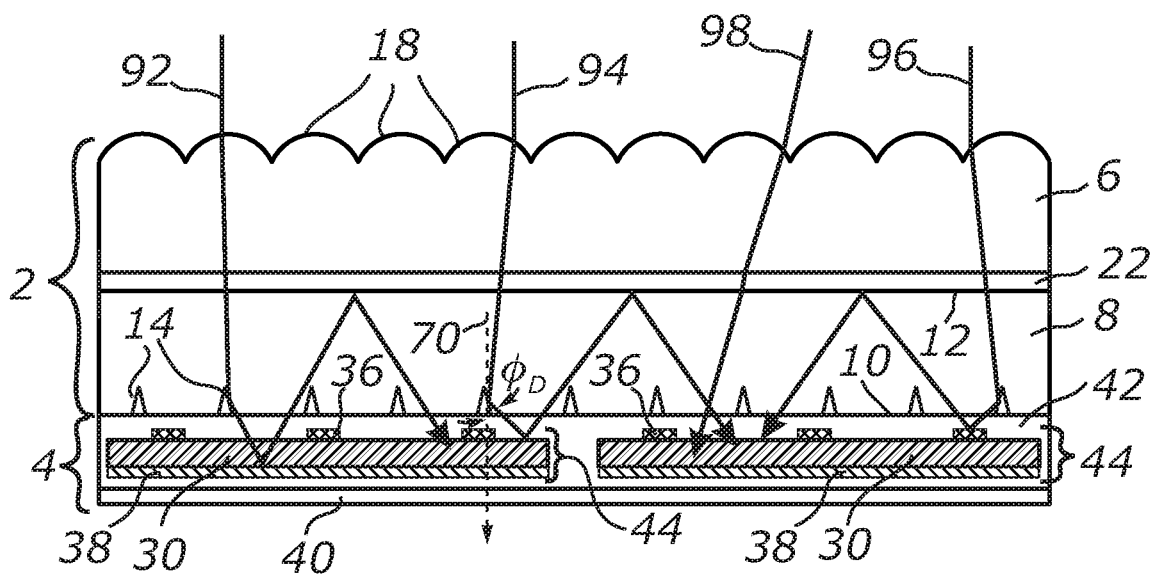
FIG. 20 is another example and raytracing of a sunlight harvesting system employing an optical cover and photovoltaic devices, according to at least one embodiment of the present invention.

In FIG. 20, an embodiment of optical cover 2 is illustrated where optical layer 8 is flipped upside down compared to FIG. 19 and where surface 12 is the light input surface and surface 10 is the light output surface of the optical layer. In this geometry of light incidence onto light deflecting elements 14, the sloped faces of the respective cavities forming light deflecting elements 14 are now redirecting the respective rays by means of TIR rather than by refraction. Due to the high aspect ratio of the cavities forming elements 14 and the resulting skew incidence angles, TIR can be easily realized at the interface between the refractive material of layer 8 and the outside medium that fills the cavities.

Optical cover 2 of FIG. 20 also employs an optional cladding layer 22 disposed between lens array 6 and transparent layer 8. Cladding layer 22 replaces the air gap of the above examples. Layer 22 should be made from a material having a lower refractive index compared to layer 8 in order to provide for TIR at surface 10 at the sufficiently high deflection angles. Suitable cladding materials may include low refractive index monomers, polymers, fluoropolymers, low-n optical adhesives, thin films, and other materials commonly used for cladding in optical waveguides, lighting panels or photovoltaic cells/panels.

The use of TIR for deflecting light by deflecting elements 14 advantageously allows for obtaining larger bend angles, if needed. This can ensure that light injected into light harvesting device 4 remains trapped by the light input surface 12 despite the refractive index of cladding layer 22 being ordinarily greater than that of the outside medium (e.g., air).

In operation, similarly to rays 82, 84, and 86 of FIG. 19, on-axis rays 92, 94 and 96 are trapped by optical cover 2 and are more efficiently absorbed by photovoltaic cells 44 of light harvesting device 4, while a stray (off-axis) ray 98 is simply transmitted to the photovoltaic cells with high optical efficiency with or without light trapping. Particularly, as illustrated by example of ray 94, said ray strikes a TIR wall of the cavity forming an individual element 14 and is deflected at propagation angle $\phi_D$ with respect to prevailing direction 70 of light propagation through optical cover 2 so that $\phi_D$ is less than 90° and greater than the TIR angle at surface 12 of layer 8.

In the above illustrated examples, metallic contact fingers 36 of photovoltaic cell 44 may be replaced by a transparent electro-conducting layer that will form the front electrodes of the solar cell. The conducting layer can be made from any conventional transparent conducting material. Particularly, transparent conducting films (TCFs) conventionally used for photovoltaic applications can be employed. TCF can be fabricated from inorganic and/or organic materials. An example of inorganic films is a layer of transparent conducting oxide (TCO). Suitable materials for the TCO include, but are not limited to, aluminum-doped zinc oxide (AZO), boron-doped zinc oxide, fluorine doped tin oxide (FTO), indium tin oxide (ITO), indium molybdenum oxide (IMO), indium zinc oxide (IZO) and tantalum oxide. The TCO layer can be deposited by any suitable process, such as chemical vapor deposition (CVD) or physical vapor deposition (PVD). The thickness of conducting layer can be fairly small, typically up to about a few thousand nanometers.

Figure 21:
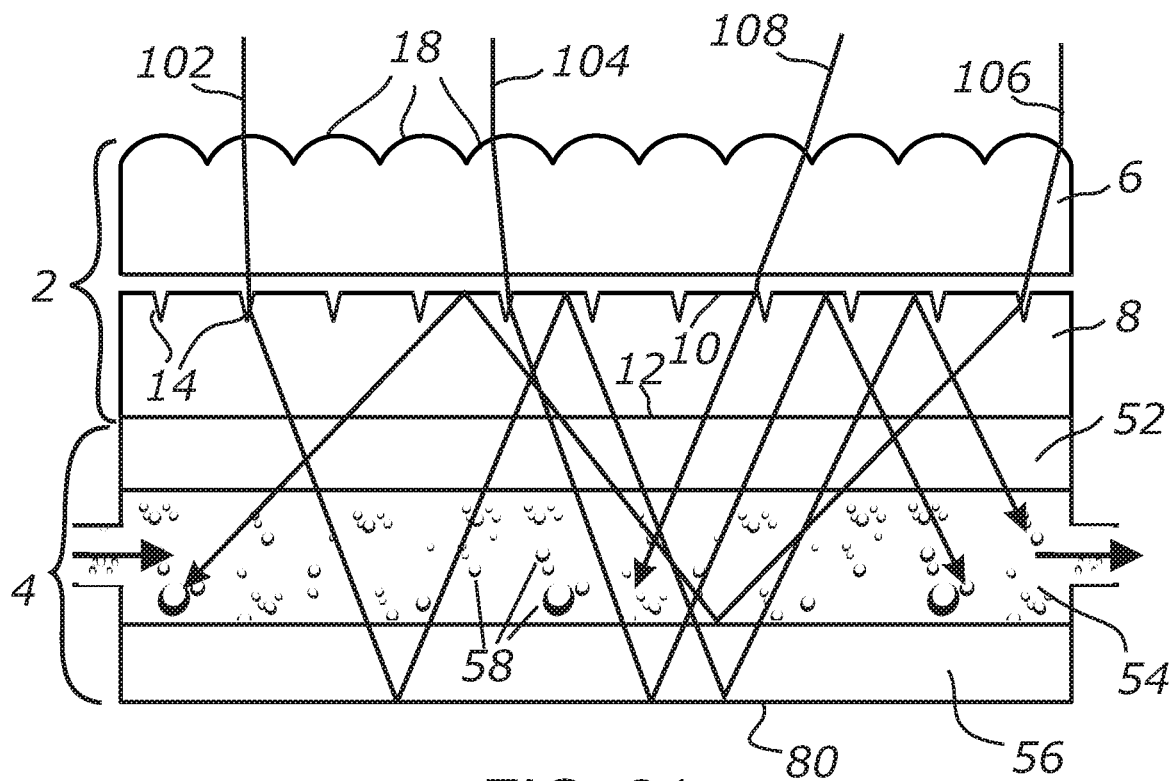
FIG. 21 is a further example and raytracing of a sunlight harvesting system employing an optical cover and liquid-carrying photo reactor, according to at least one embodiment of the present invention.

FIG. 21 illustrates an embodiment of optical cover 2 when it is applied for trapping light in light harvesting device 4 exemplified by a liquid-carrying photoreactor which can be of any suitable type. One such useful type of the photoreactor can be utilized for water and wastewater detoxification or disinfection by using sunlight or an artificial ultraviolet lamp in homogeneous systems employing oxidants (ozone, hydrogen peroxide) and far ultraviolet radiation (<280 nm) or in heterogeneous photocatalytic systems that combine near ultraviolet radiation (320 to 390 nm range) with light-activated oxidation catalysts such as titanium dioxide. Optical cover 2 can be used to efficiently capture and trap radiation from the UV source so that it can be more fully absorbed thus further enhancing the photo-reaction and water treatment efficiency.

Another useful type of the photoreactor may employ organic or inorganic photochemical synthesis of various materials or compounds in aqueous solution or other liquids by using conventional light sources or sunlight. Similarly, since this process generally involves chemical reactions that proceed with the absorption of light, optical cover 2 can be used to increase the optical path through the photo-active material and improve the light absorption and system efficiency. Since different photochemical reactions may require illumination by different portions of electromagnetic spectrum, the material of optical cover 2 may be selected according to the application-specific spectral bands to ensure that it is transparent to the desired wavelengths. Further suitable examples of useful photoreactors include photobioreactors for algae growth or the like where the absorption by a thinner layer of active substance can be beneficial for reducing the system cost or enhancing the process efficiency.

In FIG. 21, optical cover 2 employs transparent layer 8 having a plurality of light deflecting elements 14 and lens array 6 having a matching plurality of lenses 18. Light input surface 10 and light output surface 12 of layer 8 are substantially transparent and configured for an unimpeded light passage. Light deflecting elements 14 are formed by high aspect ratio cavities which can have various two-dimensional or three-dimensional shapes, as explained above. By way of an example and not limitation, light deflecting elements 14 can be formed by deep and narrow elongated grooves in surface 10 in which case lens array 6 may be formed by a lenticular lens array.

Light harvesting device 4 can have a planar configuration of the photoreactor and employ a front transparent wall 52 and a rear wall 56. However, it should be understood that the photoreactor can have any other conventional configuration, such as the tubular shape. An aqueous solution 54 contains light absorbing agents 58 (which can be, for example, impurities to be treated or algae to be grown, etc.) and is pumped through the photoreactor body confined between walls 52 and 56.

In operation, light ray 102 is focused by an individual lens 18 onto the respective light deflecting element 14 formed in surface 10 where it is further bent to a greater than the TIR angle and is directed further toward surface 12 of layer 8. Surface 12 transmits ray 102 further into light harvesting device 4 where the ray begins to interact with light absorbing solution 54. If ray 102 is not fully absorbed in a single pass from wall 52 to wall 56 of the ptotoreactor, it is reflected by wall 56 while maintaining the propagation angle with respect to the surface normal. Wall 56 can be made transparent and contacting the outside air by its external surface 80, in which case ray 102 can reflect by means of TIR from surface 80. Alternatively, surface 80 or the inner surface of wall 56 can be mirrored to provide for a specular reflectivity. Ray 102 reflected from wall 56 propagates back into cover 2 where it is reflected from surface 10 by means of TIR. This process may continue as ray 102 remains confined within the light harvesting device until it is fully absorbed. Accordingly, rays 104 and 106 are trapped by cover 2 in the light harvesting device 4 in a similar manner and are absorbed more fully than in the case of one or two passes of light through the photoabsorptive layer without additional ray bending and trapping. A stray ray 108 which is not passing through any light deflecting element 14 is still efficiently transmitted by optical cover 2 and can interact with the light absorbing medium of device 4 albeit with a reduced absorption efficiency compared to the rays which are properly trapped.

Figure 22:
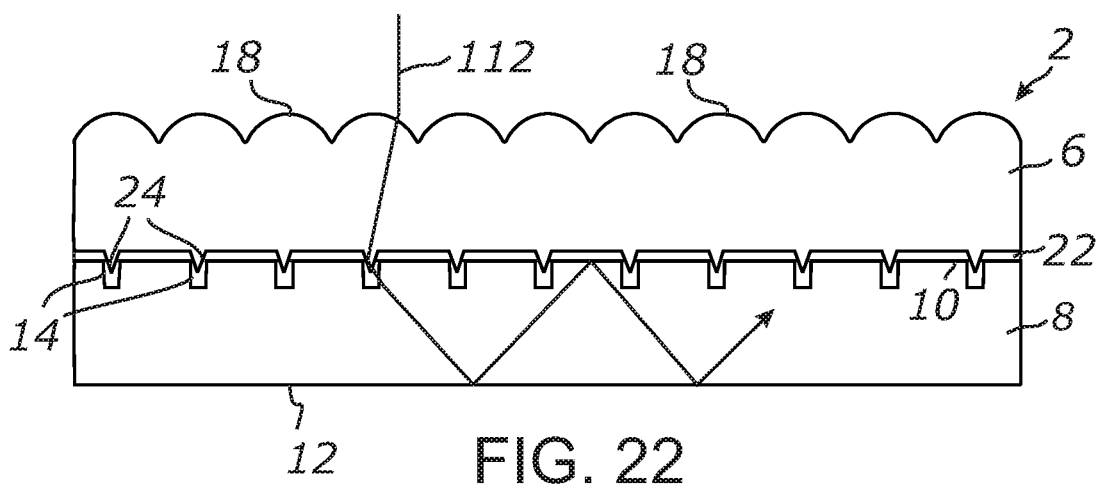
FIG. 22 is a schematic view, in a cross-section, and ray tracing of a an optical cover showing microstructures associated with a lens array, according to at least one embodiment of the present invention.

In FIG. 22, an embodiment of the present invention is illustrated in which optical cover 2 comprises transparent layer 8 having rectangular cavities formed in transparent surface 10. Lens array 6 is provided which employs a plurality or lenses 18 and is positioned adjacent to surface 10 with a small gap. Thin cladding layer 22 with a low refractive index is provided between lens array 6 and layer 8. Lens array 6 further comprises V-shaped (in a cross-section) extensions 24 distributed according to the same pattern as lenses 18 along the surface which is opposing the surface in which lenses 18 are formed. Each extension 24 has a transversal size substantially smaller than that of lenses 18 and is positioned so that it at least partially protrudes into one of the cavities of light deflecting elements 14. It is preferred that the plurality of extensions 24 is disposed in or in the immediate proximity to the focal plane of lens array 6.

FIG. 22 also schematically illustrates the operation of optical cover 2 of this embodiment. Ray 112 enters lens array 6 where it is directed, by means of focusing, by lens 18 to the respective extension 24 disposed at the opposing surface of the array. Ray 112 is refracted by extension 24 so that it receives a more slanted propagation angle within layer 8. Ray 112 is further refracted by the transparent face of light deflecting element 14 and is bent to an even greater angle with respect to the surface normal. With such a two-stage bending, ray 112 can propagate within layer 8 by bouncing from both surfaces 10 and 12 by means of TIR in which case optical cover 2 can act as a waveguide and transport light some distances along the layer 8 with a minimal loss. In FIG. 22, the individual opticules are formed by the combination of lens 18, extension 24 and light deflecting element 14 disposed along a common optical axis.

Figure 23:
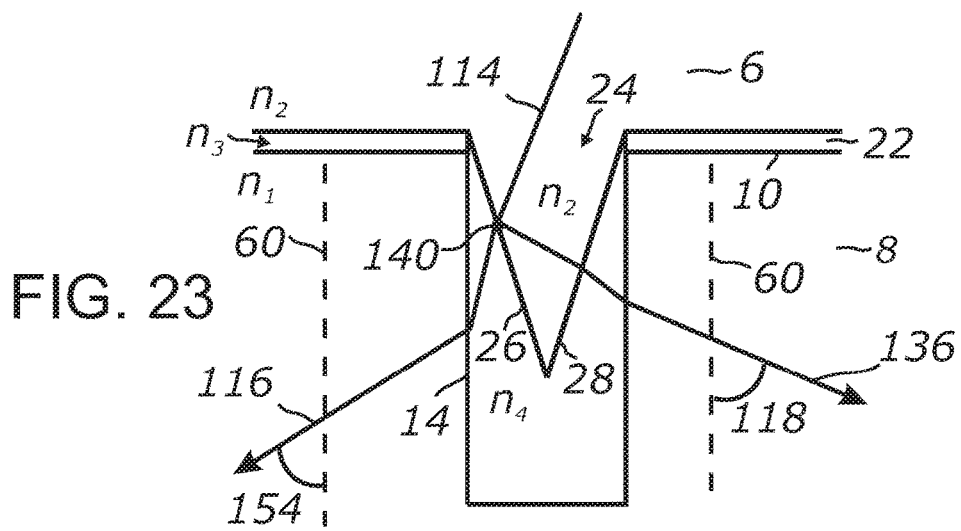
FIG. 23 is a schematic cross-sectional view showing an exemplary individual light deflecting element and raytracing, according to at least one embodiment of the present invention.

The operation of embodiment shown In FIG. 22 is further explained below in more detail with reference to FIG. 23. A ray 114 collected by an individual lens 18 (not shown in FIG. 23) of lens array 6 enters extension 24 where it strikes a face 26 at point 140 beneath the plane of surface 10 of layer 8. Face 26 is inclined at a sharp angle with respect to a normal 60 to surface 10 which is also the normal to the prevailing plane of optical cover 2. A refractive index $n_2$ of lens array 6 is greater than that of surrounding air $n_4 \approx 1$ which may normally fill the cavity of light deflecting element 14. Ray 114 undergoes refraction at face 26 and further strikes the vertical wall of the cavity forming light deflecting element 14. It will be appreciated that a portion of ray 114 can be reflected from face 26 due to the Fresnel reflection, although the energy of the reflected ray can be substantially less than that of the refracted ray up to the incidence angles approaching a TIR angle at face 26.

The refracted portion of ray 114 (indicated as a ray segment 116) undergoes a further refraction at the vertical wall of light deflecting element 14 and enters the medium of layer 8 at an angle 154 with respect to normal 60. Layer 8 has a refractive index $n_1$ which is also greater than that of air so that ray 114 bends further away from normal 60. The reflected portion of ray 114 (indicated as a ray segment 118) passes through an opposing face 28 of extension 24 and subsequently enters layer 8 at an angle 118 to normal 60, undergoing refraction each time it passes through a boundary between different optical media. The focal length of lenses 18 and the slope of faces 26 and 28 are selected to result in angles 154 and 118 being greater than the critical TIR angle $\phi_{TIR}$ at surface 10. Furthermore, in order to facilitate TIR, a refractive index $n_3$ of cladding layer 22 is selected to be sufficiently low to permit for TIR in a wide range of incidence angles.

It should be understood that light deflecting elements 14 may comprise any suitable optical features or devices that alter the light propagation through surface 10 in the desired manner. By way of example and not limitation, light deflecting elements 14 may be selected from the group of surface features consisting essentially of planar mirrors, curved mirrors, mirror arrays, prisms, prism arrays, one or more reflective or refractive surfaces, diffraction gratings, holograms, light diffusing or scattering elements, and so forth. A yet further example of a useful light deflecting element 14 can be a matte-finish textured area in surface 10 having the dimensions approximating those of the focal area of the respective lens 18. For cylindrical lenses 18, light deflecting elements 14 may be formed in surface 10 by narrow strips of light-scattering textured areas each disposed in the respective lens focus. Alternatively, elements 14 may be formed by depositing light-scattering substance in the prescribed locations of surface 10.

When light deflecting elements 14 incorporate prismatic grooved structures or other surface relief micro-structures, these can be fabricated using a technique for direct material removal including mechanical scribing, laser scribing, engraving, micromachining, etching, grinding, embossing, imprinting from a master mold, photolithography, and a plurality of other known methods and combinations thereof for structuring optical materials. In addition, the faces of prismatic grooved structures may be optionally polished to obtain any desired level of surface smoothness. Layer 8 may be configured to incorporate embedded microstructures, for example, by means of casting, embossing, extrusion, injection molding, compression molding, or similar processes and combinations of molding and machining processes thereof.

Alternatively, layer 8 can incorporate an additional layer of transparent material, such as a plastic film or thin transparent plate, attached to face 10 and the light deflecting elements 14 can be formed in that layer. Various mechanisms, including optical lithography, may be used to create the required pattern in a light-sensitive chemical photo resist by exposing it to light (typically UV) either using a projected image or an optical mask with the subsequent selective removal of unwanted parts of the thin film or the bulk of a substrate. In a further alternative, the transparent material can be overmolded onto surface 10 in the respective areas and prismatic grooved structures can be formed in the overmold. By way of a yet further non-limiting example, a negative replica of the grooves may be formed by scribing, diamond cutting/machining, laser micromachining, ion beam etching, chemical etching, or similar techniques followed by imprinting of it in the overmold.

In accordance with an embodiment of the present invention, optical cover 2 may be configured as an illumination device and may further comprise an elongated light source 145 extending along a terminal face 135 for inputting light into layer 8. Alternatively, a plurality of miniature light sources can be arranged along face 135 for this purpose. Light source 145 is positioned so that it illuminates an edge of layer 8, the edge represented by face 135, allowing the light to enter layer 8 and propagate in layer 8 generally toward an opposing face 136 while being confined between surfaces 10 and 12 due to TIR. Light source 145 can be of any known type, including but not limited to incandescent lighting, heat emitting bodies, light emitting diodes (LEDs), lasers, sunlight, light/heat scattering, radiating surfaces, or any other devices or combinations thereof adapted for generating light. The shape of the incident beam may be optionally formed by any desired optical system which provides a suitable angular and/or spatial energy distribution in the beam illuminating a side edge of layer 8. For example, optical cover 2 may be configured as an illumination device configured to produce a beam of light with a suitable angular spread. In another example, one or more optical fibers can be used to deliver and input light into layer 8 through face 135.

FIG. 26A through FIG. 26F illustrate, in a cross-section, different exemplary variations of microstructured features that may be used to form individual light deflecting elements 14.

Figure 26A:
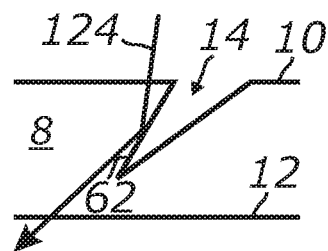
FIG. 26A through FIG. 26F illustrate various cross-sections of light deflecting elements.

FIG. 26A shows a skewed V-shaped notch or undercut made in surface 10 of layer 8. The notch has a sloped face 62 which reflects an incident ray 124 by means of TIR and deflects it from the original propagation path toward a more slanted angle with respect to the prevailing plane of layer 8. The slope of face 62 is selected to result in the propagation angle of the deflected ray 124 being greater than the TIR angle at surface 10. This ensures that any specular or TIR reflection of ray 124 from the light harvesting structure that may be placed under optical cover 2 back will not cause ray decoupling from the system and that the desired light trapping will occur. Additionally, as described in the above examples, the deflection of ray 124 further away from a normal to the surface plane results in the increase of the optical path length of the ray through a photoabsorbtive layer due to the skew incidence, which enhances the absorption efficiency and utility of the light harvesting device.

Figure 26B:
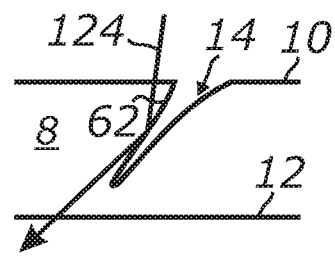

In FIG. 26B, deflecting element 14 is exemplified by an undercut having a funnel shape formed by curved walls. Such undercut may be formed, for example, by material ablation by a laser beam. In the case of layer 8 being made from acrylic, a $CO_2$ laser with the operating wavelength of about 10 microns may be used to selectively ablate the surface material and produce a profile similar to that of FIG. 26B. A funnel shape of element 14 may naturally occur during laser ablation which may also provide for the sufficiently smooth, polished walls of the undercut. The walls may also be polished in a subsequent process which may involve thermal annealing, flame polishing, laser beam heat polishing, etc. Accordingly, ray 124 is directed toward surface 12 with deflection by means of TIR at face 62. The deflection angle should be sufficient to provide for TIR at surface 10 and yet allow ray 124 to enter the underlying light harvesting device 4 (not shown) which may be coupled to surface 12 using a layer of index-matched optical anhesive or encapsulant.

Figure 26C:
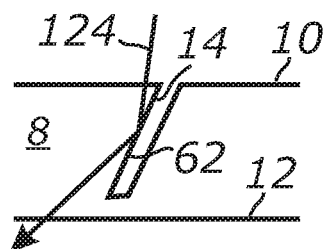
Figure 26D:
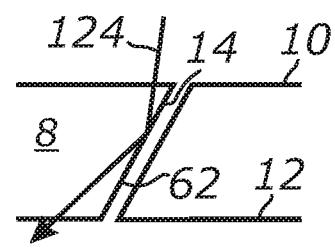

In FIG. 26C, the undercut forming light deflecting element 14 has parallel walls and a similar operation involving TIR from face 62. In FIG. 26D, light deflecting element 14 is formed by a discontinuity in layer 8 and may also represent a through cut in layer 8 which can be made by a variety of conventional means. The sloped face 62 extending all the way between surface 10 and the opposing surface 12 reflects ray 124 by means of TIR and deflects the ray at a greater-than-TIR angle with respect to a normal to surface 10.

Figure 26E:
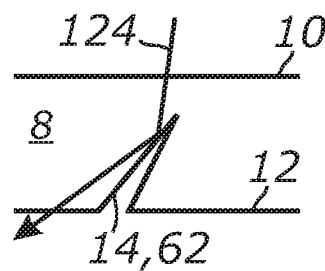

FIG. 26E illustrates in undercut or notch of element 14 formed in the opposing surface 12. Surface 12 is the light output surface in the illustrated case. Similarly, the slope of face 62 is sufficient to deflect ray 124 at a greater angle allowing for an increased propagation path length and also for the light trapping effect due to meeting the conditions of TIR at surface 10.

Figure 26F:
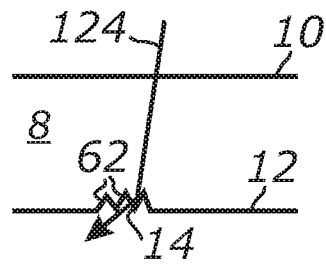
Figure 27:
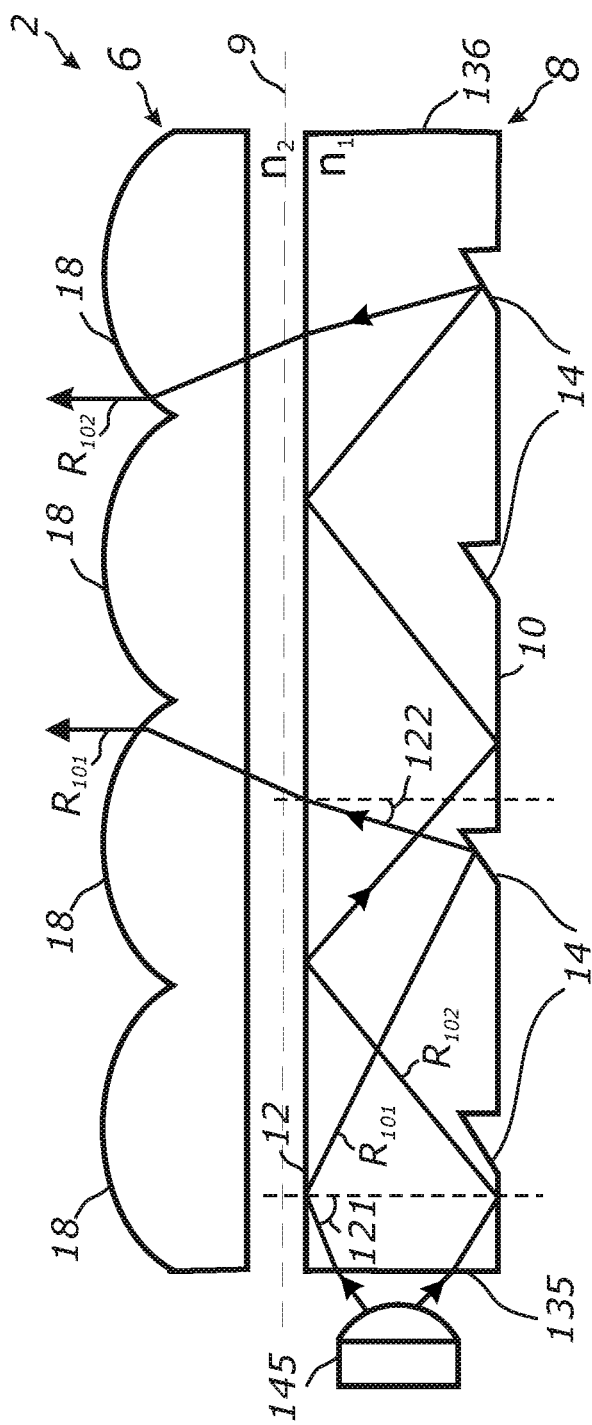
FIG. 27 is a cross section view of a planar lens array and prismatic grooved features shown operating within an illuminator according to at least one embodiment of the present invention.

In the example illustrated in FIG. 26F, light deflecting element 14 is formed by multiple corrugations of surface 12. Each corrugation has a sloped face 62 which reflects by means of TIR and deflects ray 124 at a greater angle with respect to the surface normal. The operation of light deflecting element 14 of FIG. 26F may also involve the refraction of light on the adjacent corrugations. Therefore, the slope angles of the corrugations should be selected accordingly to provide for the bend angles sufficient for satisfying the TIR condition at surface 10.

This invention is not limited to employing light deflecting elements 14 that are formed in or associated with a broad external surface of layer 8. Various optical features, such as voids redirecting light by means of TIR and/or refraction, suitable for light deflecting elements 14 may be formed in the bulk of layer 8 in any desired location between surfaces 10 and 12. One suitable method of forming light deflecting elements 14 in an intermediate location between surfaces 10 and 12 may include making a first planar sheet of transparent material having V-grooves in one of its broad surfaces and attaching a second transparent sheet on top of the microstructured surface of the first sheet.

In different variations of the present invention, lens array 6 may comprise any desired optical structures distributed over its frontal surface and adapted for collecting, concentrating or collimating the impinging light. Any known light focusing structure which collects the energy from a larger area and focuses it to a smaller focal area can be used to form the individual focusing features of lens array 6. By way of example and not limitation, lenses 18 can be spherical or aspherical, imaging or non-imaging, and may also be selected from the group of optical elements consisting essentially of Fresnel lenses, TIR lenses, gradient index lenses, diffraction lenses, lens arrays, mirrors, Fresnel mirrors, mirror arrays and the like.

A convenient way of forming lens array 6 is by providing a transparent layer having a large array of spherical imaging lenses 18 on one of its surfaces. Lenses 18 may be fabricated using any conventional method such as replication, embossing, molding, micro-machining, grinding, chemical etching, beam etching and the like. The individual lenses 18 can be integrated with lens array 6 and preferably comprise the same material as the body of the array. Alternatively, lenses 18 can be disposed on a transparent substrate plate and fabricated of the same or a different material than the substrate plate. Individual lenses 18 may also be configured as separate pieces and attached to the substrate plate. Suitable materials include but are not limited to optical glass, polymethyl methacrylate (PMMA), silicone, polycarbonate, polystyrene, polyolefin, and any optically clear resin which is obtainable by polymerization and curing of various compositions and other methods directed at creating a sufficiently optically transparent structure. The placement of lenses 18 in lens array 6 can be according to any suitable spatial metric and by any desired means. For example, lenses 18 can be spaced apart, contacting each other or overlapping and can be positioned in any desired pattern in the array.

In accordance with this invention, it is preferred that an effective focal length of each lens 18 is substantially shorter than the longitudinal or frontal dimensions of optical cover 2 in order to achieve better compactness. For the purpose of this invention, the term "effective focal length" should be understood broadly and it also includes the cases when the effective focal length of can change depending on the optical properties of the material filling up the space between lens 18 and the focal area. In other words, the location of the focal area may be different, thus resulting in a different effective focal length, when a different material separates lens 18 and its focal area. By way of example, for the same geometrical parameters of a lens forming an individual lens 18, its effective focal length can be greater in high refractive index material (e.g., glass, silicon or PMMA) than in the air due to the difference in refractive indexes.

Figure 24:
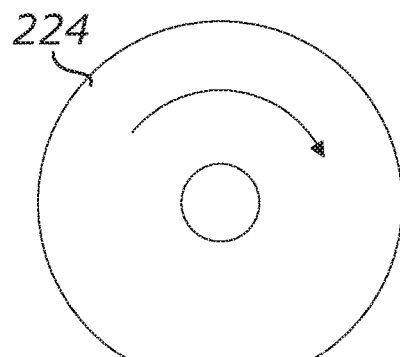
FIG. 24 is a schematic view, in a cross-section, illustrating a step in making an optical cover, according to at least one embodiment of the present invention.
Figure 24:
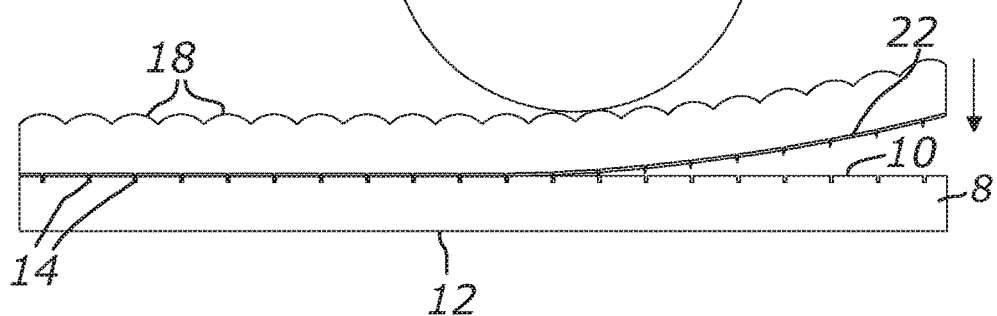
Figure 25:
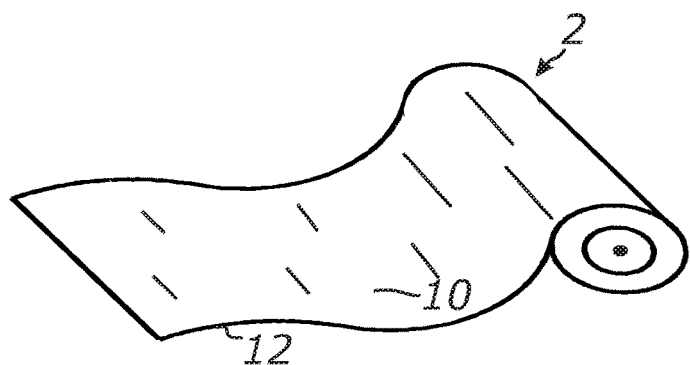
FIG. 25 is a schematic view of an optical cover in a sheet roll form, according to at least one embodiment of the present invention.

It should be understood that optical cover 2 or any of its layers can be made to any size and can also be conveniently manufactured through replication from a continuous roll or web of transparent polymeric substrate material, such as PMMA, polycarbonate, polyester or the like. By way of example and not limitation, the patterns of microstructures or surface relief features including lenses 18, cavities of light deflecting elements 14 and extensions 24, if any, can be engraved onto rolls or plates and then transferred to the substrate by means of extrusion, casting and/or embossing. As illustrated in FIG. 24, various separate layers of optical cover 2, such as, for example, lens array 6, cladding layer 22 and transparent layer 8 can subsequently be laminated on each other by a roller 224 resulting in a monolithic structure. It will be appreciated that in case of a lenticular configuration of lenses 18 and light deflecting elements 14, the lamination can be done in the direction of either parallel to the lenses 18 and elements 14 or in a perpendicular direction. As illustrated in FIG. 25, the fabricated optical cover 2 may have a form of a flexible sheet or film and can be stored or supplied in rolls. Furthermore, it may be bent to any suitable shape, such as, for example, a cylindrical shape, depending on the application.

Any of the surfaces employed in optical cover 2, especially those contacting with air, may be provided with a layer of anti-reflective coating in order to reduce the Fresnel reflections when the light refracts through the surface and improve the light transmission of the system. Alternatively, or in addition to this, an anti-reflective layer can be embedded at any suitable part of cover 2, e.g. between its layers to further promote the transmissivity and overall system efficiency. Common anti-reflective coatings such as $TiO_2$ deposited by Atmospheric Pressure Chemical Vapor Deposition (APCVD) and $Si_3N_4$ deposited by Plasma Enhanced Chemical Vapor Deposition (PECVD) may be used, for example.

According to the present invention, it may be preferred that photoabsorptive layer, or layers, if more than one, of light harvesting device 4 is relatively thin in order to reduce the intake of expensive light absorbing materials. The photoabsorptive layer can be made so thin that it absorbs only a small portion of the incident light in a single path. For example, the photoabsorptive layer thickness may be selected so that 10% or less incident light can be absorbed in a single pass through light harvesting device 4. However, due to the light trapping function of optical cover 2, the rest of the light can be absorbed through multiple passages of light through device 4 as well as through increasing the light path through the photoabsorptive layer(s) for each pass.

Further details of operation of optical cover 2 shown in the drawing figures as well as its possible variations will be apparent from the foregoing description of preferred embodiments. Although the description above contains many details, these should not be construed as limiting the scope of the invention but as merely providing illustrations of some of the presently preferred embodiments of this invention. Therefore, it will be appreciated that the scope of the present invention fully encompasses other embodiments which may become obvious to those skilled in the art, and that the scope of the present invention is accordingly to be limited by nothing other than the appended claims, in which reference to an element in the singular is not intended to mean "one and only one" unless explicitly so stated, but rather "one or more." All structural, chemical, and functional equivalents to the elements of the above-described preferred embodiment that are known to those of ordinary skill in the art are expressly incorporated herein by reference and are intended to be encompassed by the present claims. Moreover, it is not necessary for a device or method to address each and every problem sought to be solved by the present invention, for it to be encompassed by the present claims. Furthermore, no element, component, or method step in the present disclosure is intended to be dedicated to the public regardless of whether the element, component, or method step is explicitly recited in the claims. No claim element herein is to be construed under the provisions of 35 U.S.C. 112, sixth paragraph, unless the element is expressly recited using the phrase "means for."

What is claimed is:

1. An optical article for redistributing light, comprising:
a rectangular optically transmissive sheet configured to guide light using total internal reflection and having a first broad-area surface, a second broad-area surface which is parallel to the first broad-area surface, a thickness between a fraction of a millimeter and several millimeters, and length and width dimensions of 100 millimeters or more;
an artificial light source configured to illuminate the optically transmissive sheet;
a plurality of rounded ridges formed in the first broad-area surface and extending along parallel straight lines between two opposing edges of the optically transmissive sheet;
a two-dimensional pattern of discrete cavities formed in the second broad-area surface;
a light converting layer extending parallel to the optically transmissive sheet and disposed in an energy receiving relationship with respect to the optically transmissive sheet, the light converting layer comprising a first transparent wall, a second transparent wall, and a partially transmissive layer sandwiched between the first and second transparent walls;
a reflective back cover which is approximately coextensive with the optically transmissive sheet and the light converting layer; and
a total internal reflection surface located at a distance from the optically transmissive sheet and configured to reflect light using total internal reflection,
wherein at least one of the rounded ridges defines a cylindrical lens having an arcuate cross-sectional profile, wherein an area occupied by each of the discrete cavities is less than an area occupied by each of the rounded ridges, and wherein the partially transmissive layer comprises light absorbing elements distributed within an optically transmissive material and configured for absorbing and converting light emitted by the artificial light source.

2. The optical article for redistributing light as recited in claim 1, wherein the partially transmissive layer comprises titanium dioxide.

3. The optical article for redistributing light as recited in claim 1, wherein the partially transmissive layer is configured to absorb a first portion of incident light and transmit a second portion of the incident light without absorption, and wherein the light absorbing elements are configured to absorbs less light in a first wavelength than in a second wavelength which is different than the first wavelength.

4. The optical article for redistributing light as recited in claim 1, wherein the optically transmissive sheet is flexible and is formed into a curved shape.

5. The optical article for redistributing light as recited in claim 1, wherein the light converting layer is configured for absorbing and converting a portion of light emitted by the artificial light source and transmitting a second portion of the light without absorption.

6. The optical article for redistributing light as recited in claim 1, wherein the light converting layer is disposed between the optically transmissive sheet and the reflective back cover.

7. The optical article for redistributing light as recited in claim 1, wherein the light converting layer is approximately coextensive with the total internal reflection surface and is disposed between the first broad-area surface and the total internal reflection surface.

8. The optical article for redistributing light as recited in claim 1, wherein the second broad-area surface is configured to receive light both on the discrete cavities and on spacing areas separating the discrete cavities, and wherein the light converting layer is configured for absorbing a first portion of light emitted by the artificial light source in a first pass and further absorbing a second portion of the light in a second pass.

9. The optical article for redistributing light as recited in claim 1, wherein each of the discrete cavities has an elongated shape and a curved wall sloped at an angle with respect to the second broad-area surface, wherein at least some of the discrete cavities are positioned adjacent to or in a proximity to each other along a length or width dimension of the optically transmissive sheet so as to form one or more parallel bands, and wherein a longitudinal axis of at least one of the discrete cavities is aligned parallel to the one or more parallel bands.

10. The optical article for redistributing light as recited in claim 1, wherein at least some of the discrete cavities have a generally round shape and a curved wall sloped at an angle with respect to the second broad-area surface.

11. The optical article for redistributing light as recited in claim 1, comprising a regular array of prismatic surface relief features each having a triangular shape in a cross-section.

12. The optical article for redistributing light as recited in claim 1, comprising a regular array of prismatic surface relief features each having a triangular shape in a cross-section and being configured to refractively and reflectively deflect light.

13. The optical article for redistributing light as recited in claim 1, comprising light diffusing or light scattering elements.

14. The optical article for redistributing light as recited in claim 1, wherein the optically transmissive material is extending continuously along length and width dimensions of the optically transmissive sheet.

15. The optical article for redistributing light as recited in claim 1, wherein at least one of the discrete cavities is configured to receive light propagating within the optically transmissive sheet and direct at least a portion of the light out of the optically transmissive sheet at an angle with respect to a normal to the second broad-area surface.

16. The optical article for redistributing light as recited in claim 1, wherein at least one of the discrete cavities has a major dimension which is less than a major dimension of the cylindrical lens, and wherein the arcuate cross-sectional profile enables focusing a parallel beam of light into a linear focal area located within boundaries of the optically transmissive sheet.

17. The optical article for redistributing light as recited in claim 1, wherein the light converting layer is continuous and defines a broad-area light input surface and an opposing broad-area light output surface approximately coextensive with the first and second broad area surfaces, wherein a thickness of the partially transmissive layer is selected to be sufficiently low so as to cause at least a substantial portion of light received on the light input surface to pass through the optically transmissive layer without being absorbed and to exit from the light output surface.

18. The optical article for redistributing light as recited in claim 1, wherein the light converting layer comprises a plurality of discrete light absorbing areas separated from each other by non-absorbing spacing areas.

19. The optical article for redistributing light as recited in claim 1, wherein the second transparent wall is disposed in contact with ambient air.

20. A method of making an optical article for redistributing light, comprising:
- providing a planar optically transmissive sheet having a rectangular shape with four edges, a thickness between a fraction of a millimeter and several millimeters, and a width and/or length of 100 millimeters or more, wherein a first surface of the planar optically transmissive sheet has a parallel array of rounded ridges and an second surface of the planar optically transmissive sheet has a two-dimensional pattern of discrete surface cavities which are separated from each other and from the four edges by spacing areas that are generally free from the surface cavities;
- providing a light converting layer which is approximately coextensive with the optically transmissive sheet and comprising a first transparent wall, a second transparent wall, and an optically transmissive layer of a light absorbing medium sandwiched between the first and second transparent walls, wherein the light absorbing medium comprises light absorbing elements distributed in a volume of an optically transmissive material and configured for absorbing and converting light;
- providing a broad-area reflective surface configured to reflect light using total internal reflection;
- positioning the light converting layer between the optically transmissive sheet and broad-area reflective surface;
- providing an artificial light source;
- positioning the optically transmissive sheet in an energy receiving relationship with respect to the artificial light source; and
- bending the optically transmissive sheet to a curved shape.

* * * * *